(12) United States Patent
Parekh

(10) Patent No.: US 11,335,602 B2
(45) Date of Patent: May 17, 2022

(54) METHODS OF FORMING MICROELECTRONIC DEVICES, AND RELATED MICROELECTRONIC DEVICES AND ELECTRONIC SYSTEMS

(71) Applicant: Micron Technology, Inc., Boise, ID (US)

(72) Inventor: Kunal R. Parekh, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/905,763

(22) Filed: Jun. 18, 2020

(65) Prior Publication Data
US 2021/0398859 A1 Dec. 23, 2021

(51) Int. Cl.
*H01L 21/8234* (2006.01)
*H01L 21/768* (2006.01)
(Continued)

(52) U.S. Cl.
CPC ........ *H01L 21/823475* (2013.01); *H01L 21/76804* (2013.01); *H01L 21/76877* (2013.01);
(Continued)

(58) Field of Classification Search
None
See application file for complete search history.

(56) References Cited

U.S. PATENT DOCUMENTS

| 4,925,809 A | 5/1990 | Yoshiharu et al. |
| 6,165,247 A | 12/2000 | Kodas et al. |

(Continued)

FOREIGN PATENT DOCUMENTS

| JP | 2002-103299 A | 4/2002 |
| KR | 10-2009-0034570 A | 4/2009 |

(Continued)

OTHER PUBLICATIONS

Choe et al., YMTC is China's First Mass Producer of 3D NAND Flash Memory Chips, https://www.techinsights.com/blog/ymtc-chinas-first-mass-producer-3d-nand-flash-memory-chips, (Mar. 12, 2020), 3 pages.

(Continued)

*Primary Examiner* — Hsien Ming Lee
(74) *Attorney, Agent, or Firm* — TraskBritt

(57) ABSTRACT

A method of forming a microelectronic device comprises forming a microelectronic device structure comprising a base structure; a doped semiconductive material overlying the base structure; a stack structure overlying the doped semiconductive material; semiconductive structures extending from within the base structure, through the doped semiconductive structure, and into a lower portion of the stack structure; cell pillar structures horizontally aligned with the semiconductive structures and vertically extending through an upper portion of the stack structure; and digit line structures vertically overlying the stack structure. An additional microelectronic device structure comprising control logic devices is formed. The microelectronic device structure is attached to the additional microelectronic device structure to form an assembly. The base structure and portions of the semiconductive structures are removed. The doped semiconductive material is then patterned to form at least one source structure coupled to the cell pillar structures. Devices and systems are also described.

19 Claims, 15 Drawing Sheets

(51) Int. Cl.
*H01L 23/528* (2006.01)
*H01L 27/11556* (2017.01)
*H01L 27/11582* (2017.01)

(52) U.S. Cl.
CPC ...... *H01L 23/528* (2013.01); *H01L 27/11556* (2013.01); *H01L 27/11582* (2013.01)

(56) References Cited

U.S. PATENT DOCUMENTS

| | | | |
|---|---|---|---|
| 7,372,091 | B2 | 5/2008 | Leslie |
| 7,897,485 | B2 | 3/2011 | Parekh |
| 8,042,082 | B2 | 10/2011 | Solomon |
| 8,958,228 | B2 | 2/2015 | Samachisa et al. |
| 9,196,753 | B2 | 11/2015 | Ramaswamy et al. |
| 9,397,145 | B1 | 7/2016 | Sills et al. |
| 9,449,652 | B2 | 9/2016 | Juengling |
| 9,515,083 | B2 | 12/2016 | Lee et al. |
| 9,530,790 | B1 | 12/2016 | Lu et al. |
| 9,553,263 | B1 | 1/2017 | Petz et al. |
| 9,590,012 | B2 | 3/2017 | Lee et al. |
| 9,653,617 | B2 | 5/2017 | Zhou et al. |
| 9,922,716 | B2 | 3/2018 | Hsiung et al. |
| 10,141,330 | B1 | 11/2018 | Lindsay et al. |
| 10,283,703 | B2 | 5/2019 | Pellizzer et al. |
| 10,381,362 | B1 | 8/2019 | Cui et al. |
| 10,665,580 | B1 | 5/2020 | Hosoda et al. |
| 10,847,220 | B2 | 11/2020 | Castro |
| 2003/0113669 | A1 | 6/2003 | Cheng et al. |
| 2003/0151083 | A1 | 8/2003 | Matsui et al. |
| 2006/0076690 | A1 | 4/2006 | Khandros et al. |
| 2007/0288702 | A1 | 12/2007 | Roohparvar |
| 2009/0168482 | A1 | 7/2009 | Park et al. |
| 2013/0126622 | A1 | 5/2013 | Finn |
| 2013/0130468 | A1 | 5/2013 | Higashitani et al. |
| 2014/0001583 | A1 | 1/2014 | Teh et al. |
| 2014/0124726 | A1 | 5/2014 | Oh |
| 2014/0175637 | A1 | 6/2014 | Stuber et al. |
| 2015/0091180 | A1 | 4/2015 | Ong et al. |
| 2015/0243708 | A1 | 8/2015 | Ravasio et al. |
| 2015/0278675 | A1 | 10/2015 | Finn et al. |
| 2016/0104715 | A1 | 4/2016 | Pachamuthu et al. |
| 2016/0268304 | A1 | 9/2016 | Ikeda et al. |
| 2016/0343727 | A1 | 11/2016 | Kim et al. |
| 2017/0054036 | A1 | 2/2017 | Dorhout et al. |
| 2017/0092649 | A1 | 3/2017 | Takaoka |
| 2018/0158689 | A1 | 6/2018 | Mumford |
| 2019/0043836 | A1 | 2/2019 | Fastow et al. |
| 2019/0096906 | A1* | 3/2019 | Lindsay ............. H01L 23/5226 |
| 2019/0206861 | A1 | 7/2019 | Beigel et al. |
| 2019/0221557 | A1 | 7/2019 | Kim et al. |
| 2019/0229089 | A1 | 7/2019 | Zhou et al. |
| 2019/0355786 | A1 | 11/2019 | Iguchi |
| 2020/0006380 | A1 | 1/2020 | Van et al. |
| 2020/0013792 | A1 | 1/2020 | Parekh et al. |
| 2020/0013798 | A1 | 1/2020 | Parekh |
| 2020/0066745 | A1 | 2/2020 | Yu et al. |
| 2020/0135541 | A1 | 4/2020 | Wu et al. |
| 2020/0219815 | A1 | 7/2020 | Elsherbini et al. |
| 2020/0227397 | A1* | 7/2020 | Yada ...................... H01L 25/50 |
| 2020/0258816 | A1 | 8/2020 | Okina et al. |
| 2020/0258876 | A1 | 8/2020 | Hosoda et al. |
| 2020/0273840 | A1 | 8/2020 | Elsherbini et al. |
| 2021/0074711 | A1 | 3/2021 | Suzuki et al. |
| 2021/0082939 | A1 | 3/2021 | Matsuda |
| 2021/0296316 | A1 | 9/2021 | Zhu |
| 2021/0343690 | A1 | 11/2021 | Salmon |
| 2021/0398847 | A1 | 12/2021 | Parekh |
| 2022/0028830 | A1 | 1/2022 | Kirby |

FOREIGN PATENT DOCUMENTS

| | | |
|---|---|---|
| KR | 10-2015-0085155 A | 7/2015 |
| KR | 10-2020-0008606 A | 1/2020 |
| KR | 10-2020-0037444 A | 4/2020 |
| TW | 201946057 A | 12/2019 |
| WO | 2008/063251 A2 | 5/2008 |

OTHER PUBLICATIONS

Li et al., Skybridge-3D-CMOS: A Fine-Grained 3D CMOS Integrated Circuity Technology, IEEE Transactions on Nanotechnology, vol. 16, No. 4, Jul. 2017, pp. 639-652.

Micron, Introducing 2nd Generation Micron Mobile TLC 3D NAND, Industry-Leading Storage Solutions for Flagship Smartphones, (2018), 9 pages.

YMTC, About Xtacking, http://www.ymtc.com, visited Apr. 20, 2020, 3 pages.

* cited by examiner

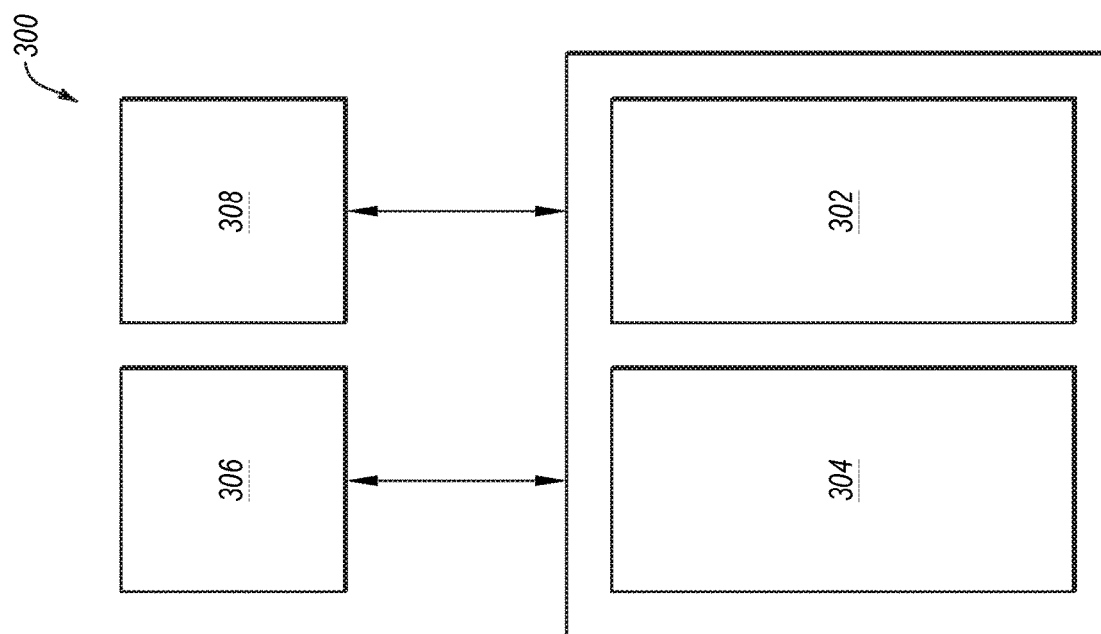

METHODS OF FORMING MICROELECTRONIC DEVICES, AND RELATED MICROELECTRONIC DEVICES AND ELECTRONIC SYSTEMS

CROSS-REFERENCE TO RELATED APPLICATIONS

This application is related to U.S. patent application Ser. No. 16/905,385, filed Jun. 18, 2020, listing Kunal R. Parekh as inventor, for "MICROELECTRONIC DEVICES, AND RELATED METHODS, MEMORY DEVICES, AND ELECTRONIC SYSTEMS." This application is also related to U.S. patent application Ser. No. 16/905,452, filed Jun. 18, 2020, listing Kunal R. Parekh as inventor, for "METHODS OF FORMING MICROELECTRONIC DEVICES, AND RELATED MICROELECTRONIC DEVICES, MEMORY DEVICES, ELECTRONIC SYSTEMS, AND ADDITIONAL METHODS." This application is also related to U.S. patent application Ser. No. 16/905,698, filed Jun. 18, 2020, listing Kunal R. Parekh as inventor, for "METHODS OF FORMING MICROELECTRONIC DEVICES, AND RELATED MICROELECTRONIC DEVICES AND ELECTRONIC SYSTEMS." This application is also related to U.S. patent application Ser. No. 16/905,747, filed Jun. 18, 2020, listing Kunal R. Parekh as inventor, for "METHODS OF FORMING MICROELECTRONIC DEVICES, AND RELATED MICROELECTRONIC DEVICES AND ELECTRONIC SYSTEMS." This application is also related to U.S. patent application Ser. No. 16/905,734, filed Jun. 18, 2020, listing Kunal R. Parekh as inventor, for "METHODS OF FORMING MICROELECTRONIC DEVICES, AND RELATED BASE STRUCTURES FOR MICROELECTRONIC DEVICES." The disclosure of each of the foregoing documents is hereby incorporated herein in its entirety by reference.

TECHNICAL FIELD

The disclosure, in various embodiments, relates generally to the field of microelectronic device design and fabrication. More specifically, the disclosure relates to methods of forming microelectronic devices, and to related microelectronic devices and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Control logic devices within a base control logic structure underlying a memory array of a memory device (e.g., a non-volatile memory device) have been used to control operations (e.g., access operations, read operations, write operations) on the memory cells of the memory device. An assembly of the control logic devices may be provided in electrical communication with the memory cells of the memory array by way of routing and interconnect structures. However, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of a memory device, and/or improvements in the performance (e.g., faster memory cell ON/OFT speed, lower threshold switching voltage requirements, faster data transfer rates, lower power consumption) of the memory device.

BRIEF DESCRIPTION OF THE DRAWINGS

FIG. 3 is a schematic block diagram of an electronic system, in accordance with an embodiment of the disclosure.

DETAILED DESCRIPTION

Figure 1A:
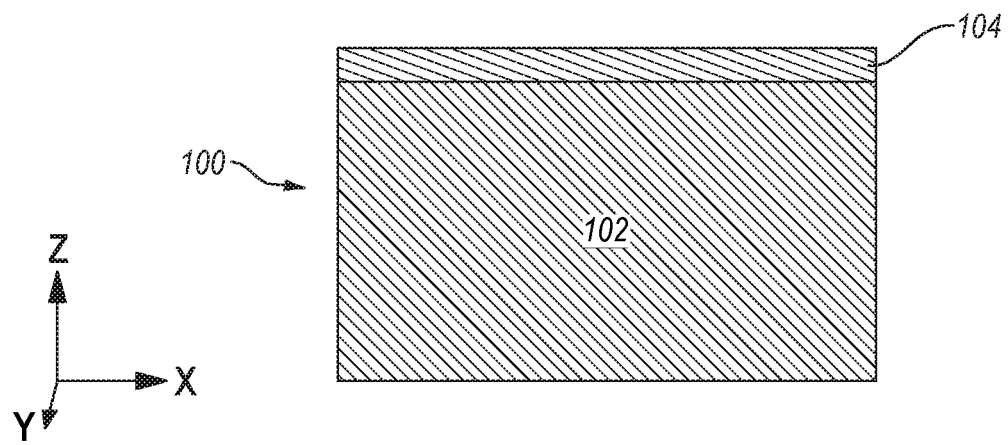
FIGS. 1A through 1F are simplified, partial cross-sectional views illustrating a method of forming a microelectronic device structure, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessary limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization, or other known methods.

FIGS. 1A through 1F are simplified partial cross-sectional views illustrating embodiments of a method of forming a microelectronic device structure (e.g., a memory device structure) for a microelectronic device (e.g., a memory device, such as a 3D NAND Flash memory device). With the description as provided below, it will be readily apparent to one of ordinary skill in the art that the methods described herein may be used in various applications. In other words, the methods of the disclosure may be used whenever it is desired to form a microelectronic device.

Referring to FIG. 1A, a microelectronic device structure 100 may be formed to include a base structure 102, and a doped semiconductive material 104 in, on, or over the base structure 102. As shown in FIG. 1A, in some embodiments, the doped semiconductive material 104 is formed on an upper surface of the base structure 102. In additional embodiments, at least one material (e.g., at least one insulative material) is formed between the base structure 102 and the doped semiconductive material 104. As a non-limiting example, a dielectric oxide material (e.g., $SiO_x$, such as silicon dioxide ($SiO_2$)) may be formed between (e.g., vertically between) the base structure 102 and the doped semiconductive material 104. In further embodiments, the doped semiconductive material 104 is also formed on or over one or more additional surfaces of the base structure 102. As a non-limiting example, a first portion the doped semiconductive material 104 may be formed on or over the upper surface of the base structure 102, and a second portion of the doped semiconductive material 104 under (e.g., under and in physical contact with) a lower surface of the base structure 102.

The base structure 102 of the microelectronic device structure 100 comprises a base material or construction upon which additional features (e.g., materials, structures, devices) of the microelectronic device structure 100 are formed. The base structure 102 may, for example, be formed of and include one or more of semiconductive material (e.g., one or more of a silicon material, such monocrystalline silicon or polycrystalline silicon (also referred to herein as "polysilicon"); silicon-germanium; germanium; gallium arsenide; a gallium nitride; gallium phosphide; indium phosphide; indium gallium nitride; and aluminum gallium nitride), a base semiconductive material on a supporting structure, glass material (e.g., one or more of borosilicate glass (BSP), phosphosilicate glass (PSG), fluorosilicate glass (FSG), borophosphosilicate glass (BPSG), aluminosilicate glass, an alkaline earth boro-aluminosilicate glass, quartz, titania silicate glass, and soda-lime glass), and ceramic material (e.g., one or more of poly-aluminum nitride (p-AlN), silicon on poly-aluminum nitride (SOPAN), aluminum nitride (AlN), aluminum oxide (e.g., sapphire; $\alpha\text{-}Al_2O_3$), and silicon carbide). The base structure 102 may be configured to facilitate safe handling of the microelectronic device structure 100 for subsequent attachment to at least one additional microelectronic device structure, as described in further detail below.

The doped semiconductive material 104 may formed of and include at least one semiconductive material doped with at least one conductive dopant (e.g., at least one n-type dopant, such as one or more of phosphorus (P), arsenic (Ar), antimony (Sb), and bismuth (Bi); at least one p-type dopant, such as one or more of boron (B), aluminum (Al), and gallium (Ga)). In some embodiments, the doped semiconductive material 104 is formed of and includes one or more of a silicon material, such as monocrystalline silicon or polycrystalline silicon; a silicon-germanium material; a germanium material; a gallium arsenide material; a gallium nitride material; and an indium phosphide material. As a non-limiting example, the doped semiconductive material 104 may be formed of and include epitaxial silicon (e.g., monocrystalline silicon formed through epitaxial growth) doped with at least one conductive dopant (e.g., at least one n-type dopant, at least one p-type dopant). As another non-limiting example, the doped semiconductive material 104 may be formed of and include polycrystalline silicon doped with at least one conductive dopant (e.g., at least one n-type dopant, at least one p-type dopant).

Figure 1B:
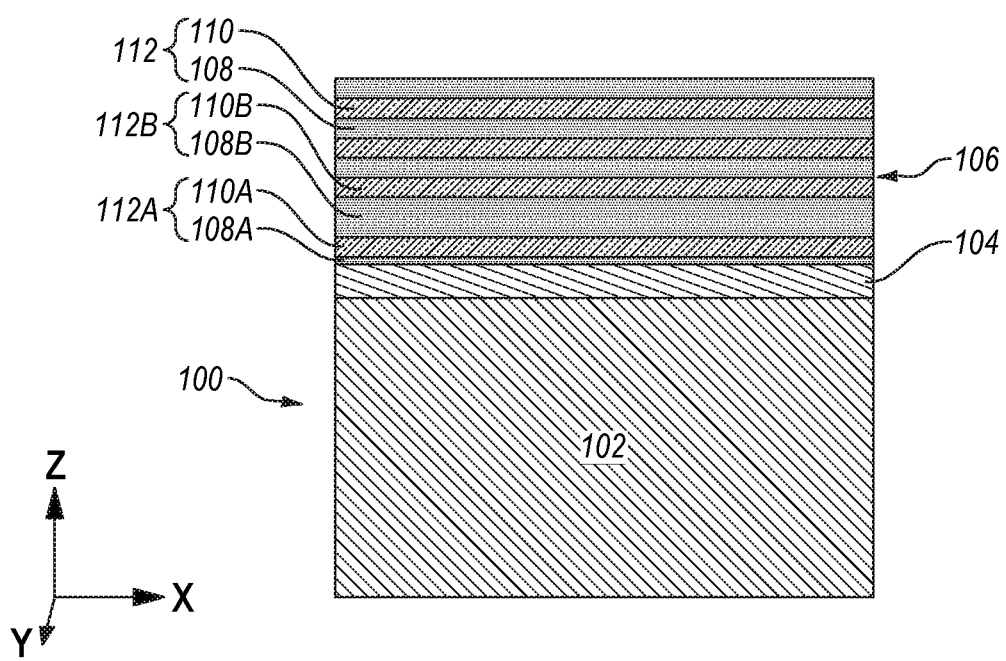

Referring next to FIG. 1B, a preliminary stack structure 106 may be formed on or over the doped semiconductive material 104. As shown in FIG. 1B, the preliminary stack structure 106 includes a vertically alternating (e.g., in the Z-direction) sequence of insulative structures 108 and sacrificial structures 110 arranged in tiers 112. Each of the tiers 112 of the preliminary stack structure 106 may include at least one of the sacrificial structures 110 vertically neighboring at least one of the insulative structures 108. The preliminary stack structure 106 may be formed to include any desired number of the tiers 112, such as greater than or equal to sixteen (16) of the tiers 112, greater than or equal to thirty-two (32) of the tiers 112, greater than or equal to sixty-four (64) of the tiers 112, greater than or equal to one hundred and twenty-eight (128) of the tiers 112, or greater than or equal to two hundred and fifty-six (256) of the tiers 112. As shown in FIG. 1B, the preliminary stack structure 106 may be formed to include a first tier 112A vertically overlying (e.g., in the Z-direction) the doped semiconductive material 104, a second tier 112B vertically overlying the first tier 112A, and an additional quantity (e.g., number, amount) of tiers 112 vertically overlying the second tier 112B. The first tier 112A may include a first insulative structure 108A and a first sacrificial structure 110A over the first insulative structure 108A; and the second tier 112B may include a second insulative structure 108B and a second sacrificial structure 110B over the second insulative structure 108B. As described in further detail below, the first sacrificial structure 110A may be employed to form select devices (also referred to herein as "selectors") for a subsequently formed microelectronic device (e.g., memory device).

As shown in FIG. 1B, the first tier 112A and the second tier 112B may be configured such that a vertical separation (e.g., in the Z-direction) between the first sacrificial structure 110A of the first tier 112A and the second sacrificial structure 110B of the second tier 112B is greater than a vertical separation between other vertically neighboring tiers 112 of the preliminary stack structure 106. For example, the second insulative structure 108B vertically interposed between the first sacrificial structure 110A and the second sacrificial structure 110B may be formed to have a relatively greater vertical thickness (e.g., in the Z-direction) than individual other of the insulative structures 108 of the preliminary stack structure 106 vertically overlying the second insulative structure 108B. A vertical thickness of the second insulative structure 108B may, for example, be formed to be from about 1.25 to about 2.5 times greater than a vertical thickness of another individual insulative structure 108 (e.g., a third insulative structure, a fourth insulative structure, a fifth insulative structure) of the preliminary stack structure 106 vertically overlying the second insulative structure 108B.

The insulative structures 108 of the tiers 112 of the preliminary stack structure 106 may be formed of and include at least one insulative material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). Each of the insulative structures 108 may individually be substantially homogeneous, may be or a substantially heterogeneous. As used herein, the term "homogeneous" means amounts of a material do not vary throughout different portions (e.g., different horizontal portions, different vertical portions) of a structure. Conversely, as used herein, the term "heterogeneous" means amounts of a material vary throughout different portions of a structure. In some embodiments, each of the insulative structures 108 is substantially homogeneous. In further embodiments, at least one of the insulative structures 108 is substantially heterogeneous. One or more of the insulative structures 108 may, for example, be formed of and include a stack (e.g., laminate) of at least two different insulative materials (e.g., at least two different dielectric materials). In some embodiments, each of the insulative structures 108 is formed of and includes a dielectric oxide material, such as $SiO_x$ (e.g., $SiO_2$). The insulative structures 108 may each be substantially planar, and may each individually exhibit a desired thickness (e.g., vertical height in the Z-direction). In addition, each of the insulative structures 108 may be substantially the same (e.g., have substantially the same material composition, material distribution, size, and shape) as one another, or at least one of the insulative structures 108 may be different (e.g., have one or more of a different material composition, a different material distribution, a different size, and a different shape) than at least one other of the insulative structures 108. In some embodiments, each of the insulative structures 108 is substantially the same as each other of the insulative structures 108.

The sacrificial structures 110 of the tiers 112 of the preliminary stack structure 106 may be formed of and include at least one material (e.g., at least one insulative material) that may be selectively removed relative to the insulative material of the insulative structures 108. A material composition of the sacrificial structures 110 is different than a material composition of the insulative structures 108. The sacrificial structures 110 may be selectively etchable relative to the insulative structures 108 during common (e.g., collective, mutual) exposure to a first etchant, and the insulative structures 108 may be selectively etchable to the sacrificial structures 110 during common exposure to a second, different etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. As a non-limiting example, the sacrificial structures 110 may be formed of and include an additional insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the sacrificial structures 110 is formed of and includes a dielectric nitride material, such as $SiN_y$ (e.g., $Si_3N_4$). Each of the sacrificial structures 110 may individually be substantially homogeneous or substantially heterogeneous. In some embodiments, each of the sacrificial structures 110 of the preliminary stack structure 106 is substantially homogeneous. In additional embodiments, at least one of the sacrificial structures 110 of the preliminary stack structure 106 is substantially heterogeneous. The sacrificial structures 110 may each be substantially planar, and may each individually exhibit a desired thickness (e.g., vertical height in the Z-direction). In addition, each of the sacrificial structures 110 may be substantially the same (e.g., exhibit substantially the same material composition, material distribution, size, and shape) as one another, or at least one of the sacrificial structures 110 may be different (e.g., exhibit one or more of a different material composition, a different material distribution, a different size, and a different shape) than at least one other of the sacrificial structures 110. In some embodiments, each of the sacrificial structures 110 is substantially the same as each other of the sacrificial structures 110.

Figure 1C:
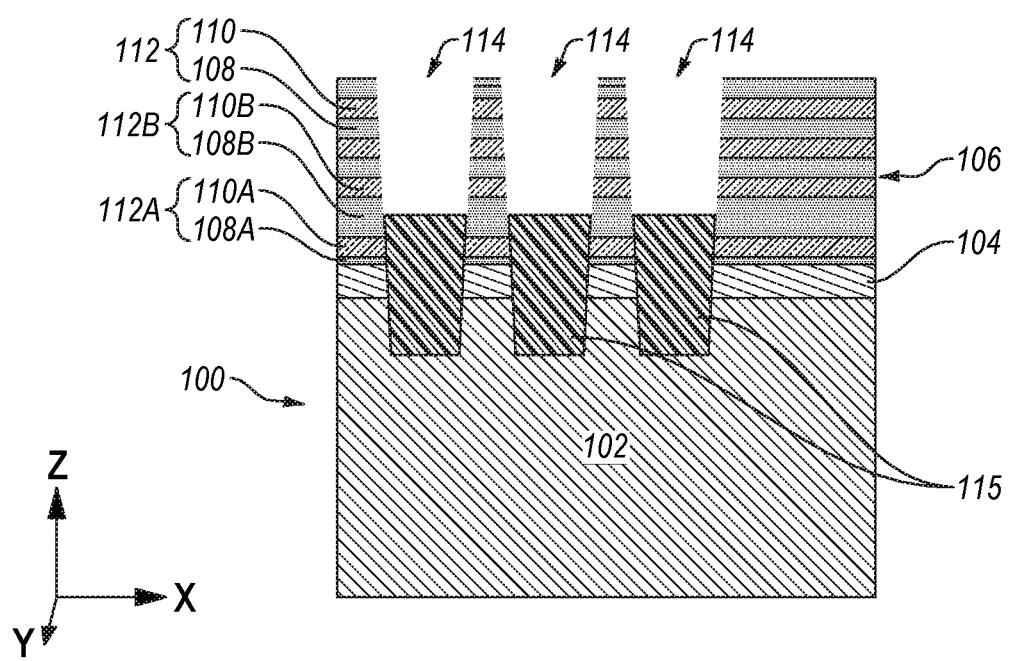

Referring next to FIG. 1C, openings 114 (e.g., apertures, vias) may be formed to vertically extend (e.g., in the Z-direction) through each of the preliminary stack structure 106 and the doped semiconductive material 104, and into the base structure 102; and then semiconductive structures 115 may be formed (e.g., epitaxially grown) within and may partially fill the openings 114. As shown FIG. 1C, the openings 114 may each individually vertically extend from an uppermost surface of the preliminary stack structure 106 to a vertical position between an uppermost surface of the base structure 102 and a lowermost surface of the base structure 102. The semiconductive structures 115 may fill lower portions of the openings 114, as described in further detail below. Remaining (e.g., unfilled), upper portions of the openings 114 may be used to form cell pillar structures employed to form vertically extending strings of memory cells, as described in further detail below.

The openings 114 may each individually be formed to exhibit a geometric configuration (e.g., dimensions, shapes) and spacing. The geometric configurations and spacing of the openings 114 may be selected at least partially based on the configurations and positions of other features of the microelectronic device structure 100. For example, the openings 114 may be sized, shape, and spaced to facilitate desired geometric configurations and spacing of additional features (e.g., additional structures, additional materials) to subsequently be formed therein. In some embodiments, each opening 114 is formed to have a substantially circular horizontal cross-sectional shape. In additional embodiments, one or more (e.g., each) of the openings 114 is formed to have a different (e.g., non-circular) horizontal cross-sectional shape, such as one or more of a tetragonal horizontal cross-sectional shape (e.g., a square horizontal cross-sectional shape), an ovular horizontal cross-sectional shape, an elliptical horizontal cross-sectional shape, a triangular horizontal cross-sectional shape, or another horizontal cross-sectional shape. Each of the openings 114 may be formed to exhibit substantially the same geometric configuration (e.g., the same dimensions and the same shape) and horizontal spacing (e.g., in the X-direction, in the Y-direction) as each other of the openings 114, or at least some of the openings 114 may be formed to exhibit a different geometric configuration (e.g., one or more different dimensions, a different shape) and/or different horizontal spacing than at least some other of the openings 114.

Still referring to FIG. 1C, within each opening 114, the semiconductive structure 115 therein may be formed (e.g., epitaxially grown) to vertically extend from a lower vertical boundary of the opening 114 within the base structure 102 (e.g., between an uppermost surface of the base structure 102 and a lowermost surface of the base structure 102) to a location vertically overlying the first sacrificial structure 110A of the first tier 112A of the preliminary stack structure 106. Each semiconductive structure 115 may vertically extend from a lower boundary within the base structure 102, through each of the doped semiconductive material 104 and the first tier 112A (including the first insulative structure 108A and the first sacrificial structure 110A thereof) of the preliminary stack structure 106, and to an upper boundary within vertically boundaries of another of the tiers 112 (e.g., within the second tier 112B) of the preliminary stack structure 106. In some embodiments, within each opening 114, an upper boundary (e.g., upper surface) of the semiconductive structure 115 therein is formed to be positioned between an upper vertical boundary (e.g., an upper surface) and a lower vertical boundary (e.g., a lower surface) of the second insulative structure 108B of the second tier 112B of the preliminary stack structure 106.

The semiconductive structures 115 may be formed of and include an epitaxial semiconductive material (e.g., a semiconductive material formed through epitaxial growth). In some embodiments, the semiconductive structures 115 are formed of and include epitaxial silicon (e.g., monocrystalline silicon formed through epitaxial growth).

Figure 1D:
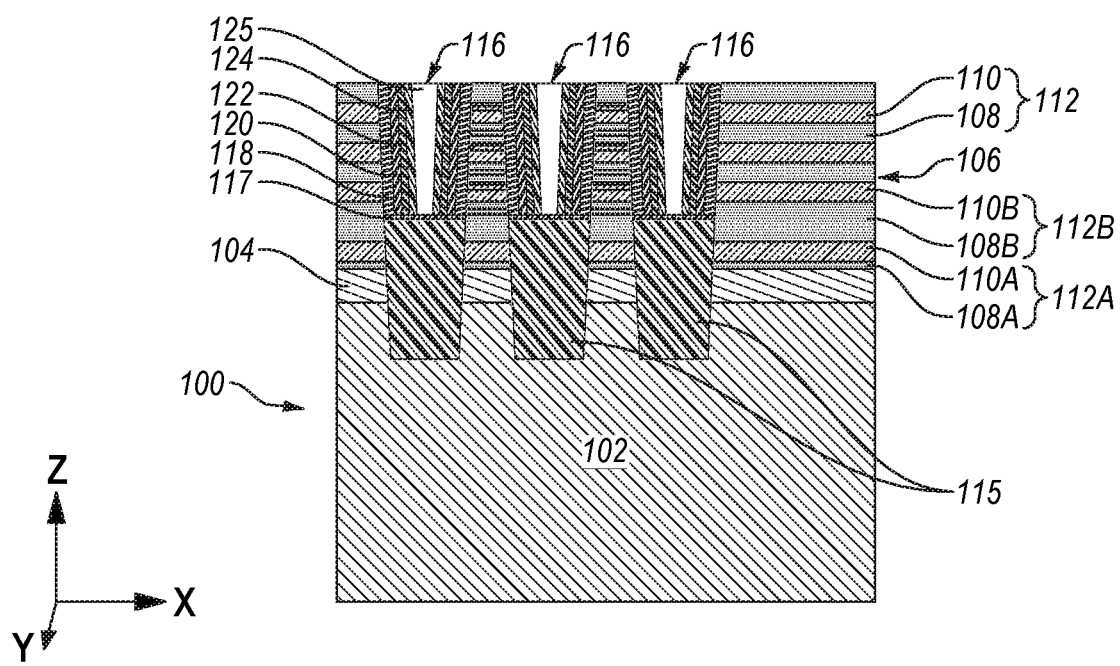

Referring next to FIG. 1D, cell pillar structures 116 and doped semiconductive structures 117 may be formed within the remaining portions of the openings 114 (FIG. 1C). The cell pillar structures 116 and the doped semiconductive structures 117 may at least partially (e.g., substantially) fill the remaining portions of the openings 114 (FIG. 1C). As shown in FIG. 1D, the doped semiconductive structures 117 may vertically intervene between the semiconductive structures 115 and the cell pillar structures 116 within the openings 114 (FIG. 1C). For example, the doped semiconductive structures 117 may be formed in or on the semiconductive structures 115, and the cell pillar structures 116 may be formed on the doped semiconductive structures 117. In some embodiments, the doped semiconductive structures 117 are positioned between an upper vertical boundary (e.g., an upper surface) and a lower vertical boundary (e.g., a lower surface) of the second insulative structure 108B of the second tier 112B of the preliminary stack structure 106. Uppermost surfaces of the cell pillar structures 116 may be substantially coplanar with the uppermost surface of the preliminary stack structure 106.

The doped semiconductive structures 117 may each individually be formed of and include at least one semiconductive material doped with at least one conductive dopant (e.g., at least one n-type dopant, such as one or more of phosphorus (P), arsenic (Ar), antimony (Sb), and bismuth (Bi); at least one p-type dopant, such as one or more of boron (B), aluminum (Al), and gallium (Ga)). A material composition of the doped semiconductive structures 117 may be substantially the same as a material composition of the doped semiconductive material 104, or the material composition of the doped semiconductive structures 117 may be different than the material composition of the doped semiconductive material 104. In some embodiments, the doped semiconductive structures 117 are formed of and include one or more of a silicon material, such as monocrystalline silicon or polycrystalline silicon; a silicon-germanium material; a germanium material; a gallium arsenide material; a gallium nitride material; and an indium phosphide material. As a non-limiting example, the doped semiconductive structures 117 may be formed of and include epitaxial silicon (e.g., monocrystalline silicon formed through epitaxial growth) doped with at least one conductive dopant (e.g., at least one n-type dopant, at least one p-type dopant). As another non-limiting example, the doped semiconductive structures 117 may be formed of and include polycrystalline silicon doped with at least one conductive dopant (e.g., at least one n-type dopant, at least one p-type dopant).

The cell pillar structures 116 may each individually be formed of and include a stack of materials facilitating the use of the cell pillar structures 116 to form vertically extending strings of memory cells following subsequent processing acts, as described in further detail below. By way of non-limiting example, each of the cell pillar structures 116 may be formed to include a first dielectric oxide material 118 (e.g., $SiO_x$, such as $SiO_2$, $AlO_x$, such as $Al_2O_3$), a dielectric nitride material 120 (e.g., $SiN_y$, such as $Si_3N_4$), a second oxide dielectric material 122 (e.g., $SiO_x$, such as $SiO_2$), a semiconductive material 124 (e.g., Si, such as polycrystalline Si), and a dielectric fill material 125 (e.g., a dielectric oxide, a dielectric nitride, air). The first dielectric oxide material 118 may be formed on or over surfaces of the microelectronic device structure 100 (e.g., surfaces of the preliminary stack structure 106, and the doped semiconductive structures 117) at boundaries (e.g., horizontally boundaries, lower vertical boundaries) of the remaining portions of the openings 114 (FIG. 1C). The dielectric nitride material 120 may be formed on or over surfaces of the first dielectric oxide material 118 within the openings 114 (FIG. 1C). The second oxide dielectric material 122 may be formed on or over surfaces of the dielectric nitride material 120 within the openings 114 (FIG. 1C). The semiconductive material 124 may be formed on or over surfaces of the second oxide dielectric material 122 within the openings 114 (FIG. 1C). The dielectric fill material 125 may occupy (e.g., fill) central portions of the openings 114 (FIG. 1C) not occupied by other features (e.g., the first dielectric oxide material 118, the dielectric nitride material 120, the second oxide dielectric material 122, the semiconductive material 124) of the cell pillar structures 116.

The cell pillar structures 116 may be formed by sequentially depositing the first dielectric oxide material 118, the dielectric nitride material 120, the second oxide dielectric material 122, and the semiconductive material 124 within the remaining portions of the openings 114 (FIG. 1D). Thereafter, portions of the first dielectric oxide material 118, the dielectric nitride material 120, the second oxide dielectric material 122, and the semiconductive material 124 at horizontally central and vertically lower positions within the remaining portions of the openings 114 (FIG. 1D) may be removed (e.g., punched through) to expose (e.g., uncover) regions of the doped semiconductive structures 117. In some embodiments, the first dielectric oxide material 118, the dielectric nitride material 120, the second oxide dielectric material 122, and the semiconductive material 124 are subjected to a punch through etch to expose the regions of the doped semiconductive structures 117. The punch through etch may also partially etch into the doped semiconductive structures 117. As the openings 114 (FIG. 1D) may horizontally taper inward as they proceed vertically deeper into the microelectronic device structure 100, the formation of the doped semiconductive material 104 may facilitate the punch through etch by effectively increasing the critical dimensions portions of the openings 114 (FIG. 1C) serving as lower boundaries for the cell pillar structures 116 relative to critical dimensions of the actual lower boundaries (e.g., the lower boundaries of the doped semiconductive material 104) of the openings 114 (FIG. 1C). Following the punch through etch, the dielectric fill material 125 may be provided on or over the semiconductive material 124, and a material removal process (e.g., planarization process, such as a CMP process) may be employed to expose an upper surface the preliminary stack structure 106 and form the cell pillar structures 116.

Figure 1E:
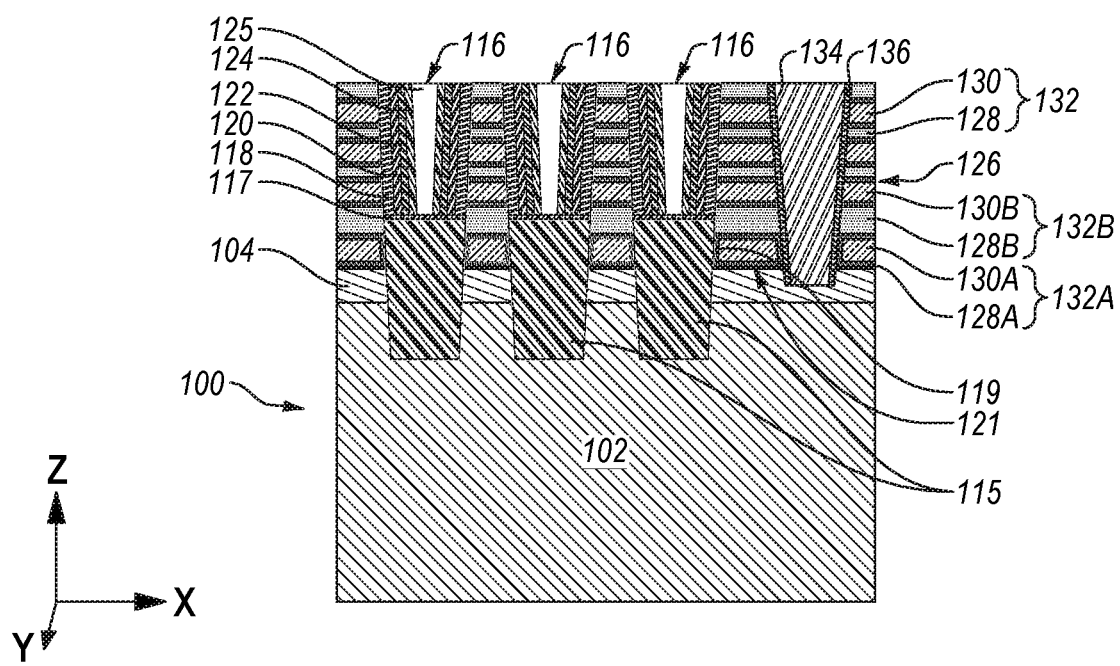

Referring next to FIG. 1E, the microelectronic device structure 100 may be subjected to so called "replacement gate" or "gate last" processing acts to at least partially replace the sacrificial structures 110 (FIG. 1D) of the preliminary stack structure 106 (FIG. 1D) with conductive structures 130 and form a stack structure 126. As shown in FIG. 1E, the stack structure 126 includes a vertically alternating (e.g., in the Z-direction) sequence of additional insulative structures 128 and the conductive structures 130 arranged in tiers 132. The additional insulative structures 128 may correspond to remainders (e.g., remaining portions, unremoved portions) of the insulative structures 108 (FIG. 1D) of the preliminary stack structure 106 (FIG. 1D) following the "replacement gate" processing acts. In addition, deep contact structures 134 may be formed to vertically extend through the stack structure 126 and to or into the doped semiconductive material 104. The deep contact structures 134 may be electrically isolated from the conductive structures 130 of the tiers 132 of the stack structure 126 by way of insulative liner structures 136 formed to horizontally intervene between the deep contact structures 134 and the stack structure 126.

Each of the tiers 132 of the stack structure 126 includes at least one of the conductive structures 130 vertically neighboring at least one of the additional insulative structures 128. As shown in FIG. 1E, the stack structure 126 may be formed to include a first tier 132A vertically overlying (e.g., in the Z-direction) the doped semiconductive material 104, a second tier 132B vertically overlying the first tier 132A, and an additional quantity (e.g., number, amount) of tiers 132 vertically overlying the second tier 132B. The first tier 132A may include a first additional insulative structure 128A and a first conductive structure 130A over the first additional insulative structure 128A; and the second tier 132B may include a second additional insulative structure 128B and a second conductive structure 130B over the second additional insulative structure 128B. As described in further detail below, the first conductive structure 130A may be employed to form select devices for a subsequently formed microelectronic device (e.g., memory device).

The conductive structures 130 of the tiers 132 of the stack structure 126 may be formed of and include conductive material. By way of non-limiting example, the conductive structures 130 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the conductive structures 130 are formed of and include W. Each of the conductive structures 130 may individually be substantially homogeneous, or one or more of the conductive structures 130 may individually be substantially heterogeneous. In some embodiments, each of the conductive structures 130 is formed to be substantially homogeneous. In additional embodiments, each of the conductive structures 130 is formed to be heterogeneous. Each conductive structures 130 may, for example, be formed of and include a stack of at least two different conductive materials.

Still referring to FIG. 1E, gate dielectric material 119 may be formed around the conductive structures 130. The gate dielectric material 119 may be formed of and include at least one dielectric material, such as one or more of at least one dielectric oxide material (e.g., one or more of $SiO_x$, $AlO_x$, phosphosilicate glass, borosilicate glass, borophosphosilicate glass, fluorosilicate glass), at least one dielectric nitride material (e.g., $SiN_y$), and at least one low-K dielectric material (e.g., one or more of $SiO_xC_y$, $SiO_xN_y$, $SiC_xO_yH_z$, and $SiO_xC_zN_y$). In some embodiments, each of the gate dielectric material 119 is formed of and includes at least one dielectric oxide material (e.g., $SiO_x$, such as $SiO_2$).

As shown in FIG. 1E, within the first tier 132A of the stack structure 126, the combination of the first conductive structure 130A, the gate dielectric material 119, and the semiconductive structures 115 may form select devices 121. In embodiments wherein the gate dielectric material 119 is formed of and includes a dielectric oxide material (e.g., $SiO_x$, such as $SiO_2$), the select devices 121 comprise metal-oxide-semiconductor (MOS) select devices (also referred to herein as "MOS selectors"). The first conductive structure 130A may serve as a metal structure for the select devices 121 (e.g., MOS selectors), the semiconductive structures 115 may serve as semiconductive structures for the select devices 121 (e.g., MOS selectors), and the gate dielectric material 119 may intervene between the first conductive structure 130A and the semiconductive structures 115. As shown in FIG. 1E, for an individual select device 121 (e.g., an individual MOS selector), the gate dielectric material 119 thereof may be horizontally interposed between side surfaces of the first conductive structure 130A and an individual semiconductive structure 115 associated with the select device 121.

Still referring to FIG. 1E, one or more additional, liner materials (e.g., insulative liner material, conductive liner material) may also be formed around the conductive structures 130. The additional, liner material(s) may, for example, be formed of and include one or more a metal (e.g., titanium, tantalum), an alloy, a metal nitride (e.g., tungsten nitride, titanium nitride, tantalum nitride), and a metal oxide (e.g., aluminum oxide). In some embodiments, the additional, liner material(s) comprise at least one conductive material employed as a seed material for the formation of the conductive structures 130. In some such embodiments, the additional, liner material(s) comprise titanium nitride. In further embodiments, the additional, liner material(s) further include aluminum oxide. As a non-limiting example, aluminum oxide may be formed directly adjacent the one or more of the gate dielectric material 119 and the additional insulative structures 128, titanium nitride may be formed directly adjacent the aluminum oxide, and tungsten may be formed directly adjacent the titanium nitride. For clarity and ease of understanding the description, the additional, liner material(s) are not illustrated in FIG. 1E, but it will be understood that the additional, liner material(s) may be disposed around the conductive structures 130.

To form the stack structure 126 through "replacement gate" processing acts, slots (e.g., slits, trenches) may be formed to vertically extend through the preliminary stack structure 106 (FIG. 1D) to form discrete blocks. Thereafter, portions of the sacrificial structures 110 (FIG. 1D) of the preliminary stack structure 106 (FIG. 1D) may be selectively removed (e.g., selectively etched and exhumed) through the slots, and replaced with dielectric material and conductive material to form the gate dielectric material 119 and the conductive structures 130. Some of the conductive structures 130 may function as access line structures (e.g., word line structures) for a microelectronic device (e.g., a memory device, such as a 3D NAND Flash memory device) to subsequently be formed using the microelectronic device structure 100, and other of the conductive structures 130 (e.g., the first conductive structure 130A) may function as select gate structures for the subsequently formed microelectronic device. Following the formation of the conductive structures 130 the slots may be filled with at least one dielectric material.

With continued reference to FIG. 1E, intersections of the cell pillar structures 116 and the conductive structures 130 of the tiers 132 of the stack structure 126 may define vertically extending strings of memory cells 138 coupled in series with one another within the stack structure 126. In some embodiments, the memory cells 138 formed at the intersections of the conductive structures 130 and the cell pillar structures 116 within different tiers 132 of the stack structure 126 comprise so-called "MONOS" (metal-oxide-nitride-oxide-semiconductor) memory cells. In additional embodiments, the memory cells 138 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 138 comprise so-called "floating gate" memory cells including floating gates (e.g., metallic floating gates) as charge storage structures. The floating gates may horizontally intervene between central structures of the cell pillar structures 116 and the conductive structures 130 of the different tiers 132 of the stack structure 126.

The deep contact structures 134 may be configured and positioned to electrically connect one or more features to subsequently be formed over the stack structure 126 with one or more other features (e.g., the doped semiconductive material 104, additional features to subsequently be formed and coupled to the doped semiconductive material 104) underlying the stack structure 126. The deep contact structures 134 may be formed of and include conductive material. In some embodiments, the deep contact structures 134 are formed of and include W. In additional embodiments, the deep contact structures 134 are formed of and include conductively doped polysilicon.

The insulative liner structures 136 continuously extend over and substantially cover side surfaces of the deep contact structures 134. The insulative liner structures 136 may be formed over and include at least one insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the insulative liner structures 136 is formed of and includes at least one dielectric oxide material (e.g., $SiO_x$, such as $SiO_2$).

Figure 1F:
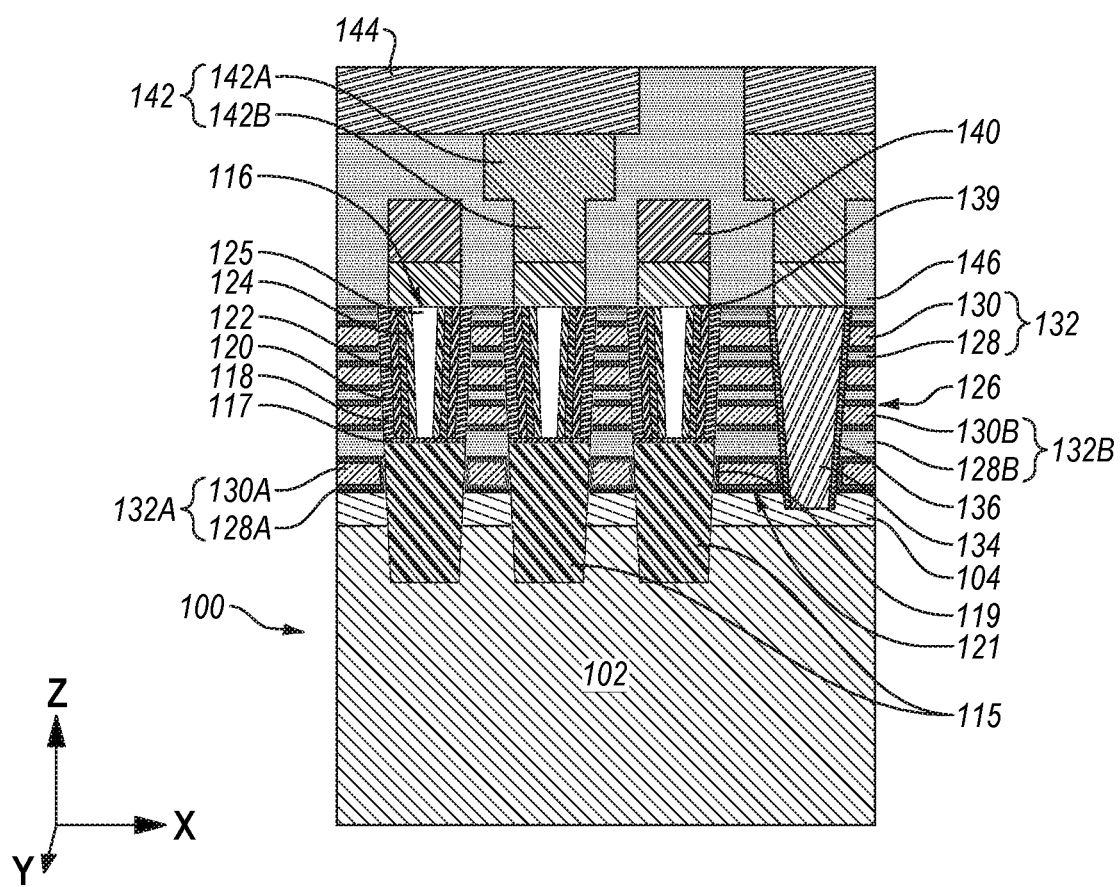

Referring next to FIG. 1F, digit line structures 139 (e.g., data line structures, bit line structures), insulative line structures 140, digit line contact structures 142, bond pads 144, and isolation material 146 may be formed on or over the stack structure 126. The digit line structures 139 may be formed vertically over and in electrical communication with the vertically extending strings of memory cells 138 and the deep contact structures 134. The insulative line structures 140 may be formed on or over the digit line structures 139. The digit line contact structures 142 may vertically extend through the insulative line structures 140, and may contact the digit line structures 139. For each digit line contact structure 142, a first portion 142A thereof may vertically overlie one of the insulative line structures 140, and a second portion 142B thereof may vertically extend through the insulative line structure 140 and contact (e.g., physically contact, electrically contact) one of the digit line structures

139. The bond pads 144 may be formed on or over the digit line contact structures 142. The isolation material 146 may cover and surround of portions of the stack structure 126, the digit line structures 139, the insulative line structures 140, the digit line contact structures 142, and the bond pads 144.

The digit line structures 139 may exhibit horizontally elongate shapes extending in parallel in a first horizontal direction (e.g., the Y-direction). As used herein, the term "parallel" means substantially parallel. The digit line structures 139 may each exhibit substantially the same dimensions (e.g., width in the X-direction, length in a Y-direction, height in the Z-direction), shape, and spacing (e.g., in the X-direction). In additional embodiments, one or more of the digit line structures 139 may exhibit one or more of at least one different dimension (e.g., a different length, a different width, a different height) and a different shape than one or more other of the digit line structures 139, and/or the spacing (e.g., in the X-direction) between at least two horizontally neighboring digit line structures 139 may be different than the spacing between at least two other horizontally neighboring digit line structures 139.

The digit line structures 139 may be formed of and include conductive material. By way of non-limiting example, the digit line structures 139 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the digit line structures 139 are each individually formed of and include W. Each of the digit line structures 139 may individually be substantially homogeneous, or one or more of the digit line structures 139 may individually be substantially heterogeneous. If a digit line structure 139 is heterogeneous, amounts of one or more elements included in the digit line structure 139 may vary stepwise (e.g., change abruptly), or may vary continuously (e.g., change progressively, such as linearly, parabolically) throughout different portions of the digit line structure 139. In some embodiments, each of the digit line structures 139 is substantially homogeneous. In additional embodiments, each of the digit line structures 139 is heterogeneous. Each digit line structures 139 may, for example, be formed of and include a stack of at least two different conductive materials.

The insulative line structures 140 may serve as insulative cap structures (e.g., dielectric cap structures) for the digit line structures 139. The insulative line structures 140 may have horizontally elongate shapes extending in parallel in the first horizontal direction (e.g., the Y-direction). Horizontal dimensions, horizontal pathing, and horizontal spacing of the insulative line structures 140 may be substantially the same and the horizontal dimensions, horizontal pathing, and horizontal spacing of the digit line structures 139.

The insulative line structures 140 may be formed of and include insulative material. By way of non-limiting example, the insulative line structures 140 may each individually be formed of and include a dielectric nitride material, such as $SiN_y$ (e.g., $Si_3N_4$). The insulative line structures 140 may each be substantially homogeneous, or one or more of the insulative line structures 140 may be heterogeneous. If an insulative line structure 140 is heterogeneous, amounts of one or more elements included in the insulative line structure 140 may vary stepwise (e.g., change abruptly), or may vary continuously (e.g., change progressively, such as linearly, parabolically) throughout different portions of the insulative line structure 140. In some embodiments, each of the insulative line structures 140 is substantially homogeneous. In additional embodiments, each of the insulative line structures 140 is heterogeneous. Each insulative line structures 140 may, for example, be formed of and include a stack of at least two different dielectric materials.

Still referring to FIG. 1F, individual digit line contact structures 142 may be at least partially (e.g., substantially) horizontally aligned in the X-direction with individual insulative line structures 140 (and, hence, individual digit line structures 139). For example, horizontal centerlines of the digit line contact structures 142 in the X-direction may be substantially aligned with horizontal centerlines of the insulative line structures 140 in the X-direction. In addition, the digit line contact structures 142 may be formed at desired locations in the Y-direction along the insulative line structures 140 (and, hence, the digit line structures 139). In some embodiments, at least some of the digit line contact structures 142 are provided at different positions in the Y-direction than one another. For example, a first of the digit line contact structures 142 may be provided at different position along a length in the Y-direction of a first of the insulative line structures 140 as compared to a position of a second of the digit line contact structures 142 along a length in the Y-direction of a second of the insulative line structures 140. Put another way, at least some (e.g., all) of the digit line contact structures 142 may be horizontally offset from one another in the Y-direction. In additional embodiments, two or more of the digit line contact structures 142 are horizontally aligned with one another in the Y-direction. In some embodiments, the digit line contact structures 142 are employed as digit line contact structures (e.g., data line contact structures, bit line contact structures) for a microelectronic device (e.g., a memory device) to be formed using the microelectronic device structure 100, as described in further detail below.

The digit line contact structures 142 may be formed to exhibit desired geometric configurations (e.g., desired dimensions, desired shapes). As shown in FIG. 1F, in some embodiments, the first portion 142A (e.g., upper portion) of an individual digit line contact structure 142 is formed to wider than the second portion 142B (e.g., lower portion) of the digit line contact structure 142. Side surfaces of the isolation material 146 may define horizontal boundaries of the digit line contact structure 142. The digit line contact structures 142 may vertically extend (e.g., in the Z-direction) from lower vertical boundaries (e.g., lower surfaces) of the bond pads 144 to upper vertical boundaries (e.g., upper surfaces) of the digit line structures 139.

The digit line contact structures 142 may each individually be formed of and include conductive material. By way of non-limiting example, the digit line contact structures 142 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the digit line contact structures 142 are formed of and include Cu. In additional embodiments, the digit line contact structures 142 are formed of and include W.

The bond pads 144 may be formed on or over upper surfaces of the digit line contact structures 142. The bond pads 144 may be formed to horizontally extend over multiple insulative line structures 140 (and, hence, over multiple digit line structures 139). Individual bond pads 144 may be coupled to individual digit line contact structures 142. The bond pads 144 may be employed to couple the digit line contact structures 142 to additional bond pads and additional conductive contact structures, as described in further detail below.

The bond pads 144 may each individually be formed of and include conductive material. By way of non-limiting example, the bond pads 144 may be formed of and include one or more of at least one metal, at least one alloy, and at least one conductive metal-containing material (e.g., a conductive metal nitride, a conductive metal silicide, a conductive metal carbide, a conductive metal oxide). A material composition of the bond pads 144 may be substantially the same as a material composition of the digit line contact structures 142, or the material composition of the bond pads 144 may be different than the material composition of the digit line contact structures 142. In some embodiments, the bond pads 144 are formed of and include Cu.

Still referring to FIG. 1F, the isolation material 146 may be formed of and include at least one insulative material. By way of non-limiting example, the isolation material 146 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the isolation material 146 is formed of and includes $SiO_x$ (e.g., $SiO_2$). The isolation material 146 may be substantially homogeneous, or the isolation material 146 may be heterogeneous. If the isolation material 146 is heterogeneous, amounts of one or more elements included in the isolation material 146 may vary stepwise (e.g., change abruptly), or may vary continuously (e.g., change progressively, such as linearly, parabolically) throughout different portions of the isolation material 146. In some embodiments, the isolation material 146 is substantially homogeneous. In additional embodiments, the isolation material 146 is heterogeneous. The isolation material 146 may, for example, be formed of and include a stack of at least two different dielectric materials.

The microelectronic device structure 100 following the process stage previously described with reference to FIG. 1F may be used to form a microelectronic device (e.g., a memory device, such as a 3D NAND Flash memory device) of the disclosure. By way of non-limiting example, FIGS. 2A through 2H are simplified, partial cross-sectional views illustrating a method of forming a microelectronic device, in accordance with embodiments of the disclosure. With the description provided below, it will be readily apparent to one of ordinary skill in the art that the methods and structures described herein may be used to form various devices and electronic systems.

Figure 2A:
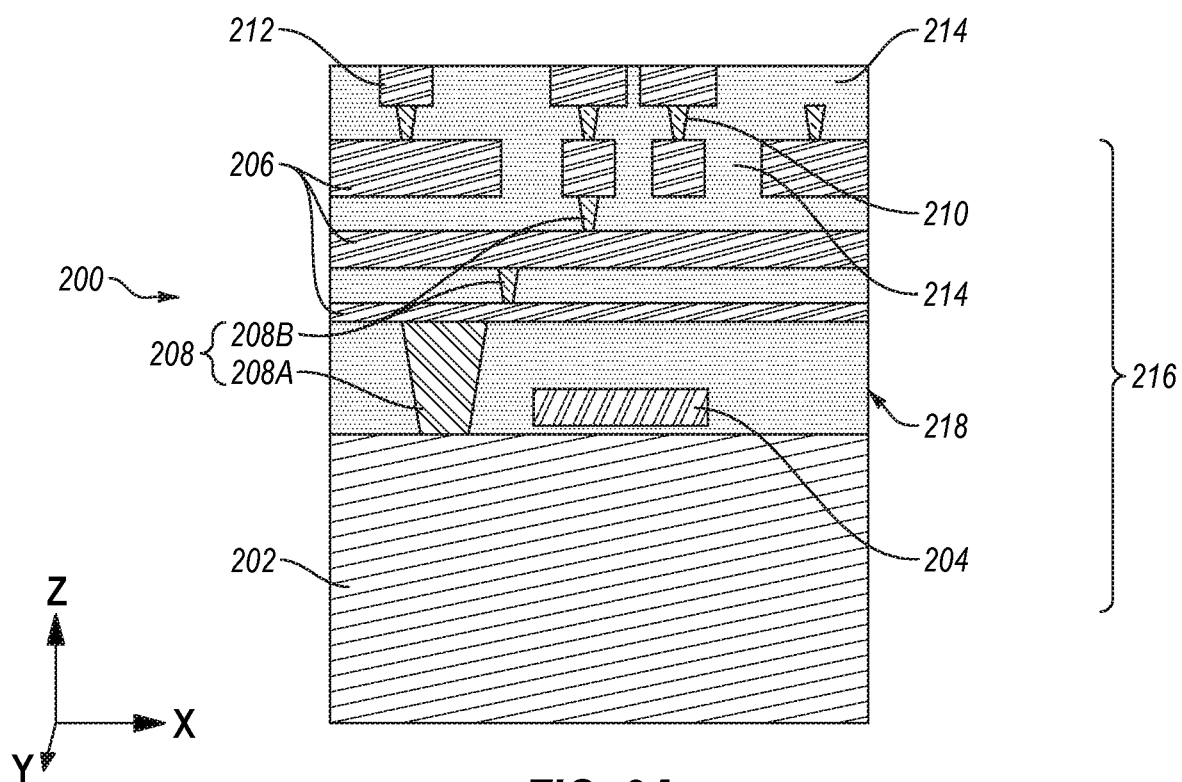
FIGS. 2A through 2H are simplified, partial cross-sectional views illustrating a method of forming a microelectronic device using the microelectronic device structure formed through the method described with reference to FIGS. 1A through 1F, in accordance with embodiments of the disclosure.

Referring to FIG. 2A, an additional microelectronic device structure 200 to subsequently be attached to the microelectronic device structure 100 (FIG. 1F) may be formed. The additional microelectronic device structure 200 may be formed to include a semiconductive base structure 202, gate structures 204, first routing structures 206, first contact structures 208, second contact structures 210, additional bond pads 212, and an additional isolation material 214. The additional microelectronic device structure 200 may form a control logic region 216 of a microelectronic device to subsequently be formed using the additional microelectronic device structure 200 and the microelectronic device structure 100 (FIG. 1F), as described in further detail below. Portions of the semiconductive base structure 202, the gate structures 204, the first routing structures 206, and the first contact structures 208 of the additional microelectronic device structure 200 form various control logic devices 218 of the control logic region 216, as also described in further detail below.

The semiconductive base structure 202 (e.g., semiconductive wafer) of the additional microelectronic device structure 200 comprises a base material or construction upon which additional features (e.g., materials, structures, devices) of the additional microelectronic device structure 200 are formed. The semiconductive base structure 202 may comprise a semiconductive structure (e.g., a semiconductive wafer), or a base semiconductive material on a supporting structure. For example, the semiconductive base structure 202 may comprise a conventional silicon substrate (e.g., a conventional silicon wafer), or another bulk substrate comprising a semiconductive material. In some embodiments, the semiconductive base structure 202 comprises a silicon wafer. In addition, the semiconductive base structure 202 may include one or more layers, structures, and/or regions formed therein and/or thereon. For example, the semiconductive base structure 202 may include conductively doped regions and undoped regions. The conductively doped regions may, for example, be employed as source regions and drain regions for transistors of the control logic devices 218 of the control logic region 216; and the undoped regions may, for example, be employed as channel regions for the transistors of the control logic devices 218.

As shown in FIG. 2A, the gate structures 204 of the control logic region 216 of the additional microelectronic device structure 200 may vertically overlie (e.g., in the Z-direction) portions of the semiconductive base structure 202. The gate structures 204 may individually horizontally extend between and be employed by transistors of the control logic devices 218 within the control logic region 216 of the additional microelectronic device structure 200. The gate structures 204 may be formed of and include conductive material. A gate dielectric material (e.g., a dielectric oxide) may vertically intervene (e.g., in the Z-direction) between the gate structures 204 and channel regions (e.g., within the semiconductive base structure 202) of the transistors.

The first routing structures 206 may vertically overlie (e.g., in the Z-direction) the semiconductive base structure 202, and may be electrically connected to the semiconductive base structure 202 by way of the first contact structures 208. The first routing structures 206 may serve as local routing structures for a microelectronic device to subsequently be formed using the additional microelectronic device structure 200 and the microelectronic device structure 100 (FIG. 1F). A first group 208A of the first contact structures 208 may vertically extend between and couple regions (e.g., conductively doped regions, such as source regions and drain regions) of the semiconductive base structure 202 to one or more of the first routing structures 206. In addition, a second group 208B of the first contact structures 208 may vertically extend between and couple some of the first routing structures 206 to one another.

The first routing structures 206 may each individually be formed of and include conductive material. By way of non-limiting example, the first routing structures 206 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first routing structures 206 are formed of and include Cu. In additional embodiments, the first routing structures 206 are formed of and include W.

The first contact structures 208 (including the first group 208A and the second group 208B thereof) may each individually be formed of and include conductive material. By way of non-limiting example, the first routing structures 206 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first contact structures 208 are formed of and include Cu. In additional embodiments, the first contact structures 208 are formed of and include W. In further embodiments, the first contact structures 208 of the first group 208A of the first contact structures 208 are formed of and include first conductive material (e.g., W); and the first contact structures 208 of the second group 208B of the first contact structures 208 are formed of and include a second, different conductive material (e.g., Cu).

As previously mentioned, portions of the semiconductive base structure 202 (e.g., conductively doped regions serving as source regions and drain regions, undoped regions serving as channel regions), the gate structures 204, the first routing structures 206, and the first contact structures 208 form various control logic devices 218 of the control logic region 216. In some embodiments, the control logic devices 218 comprise complementary metal oxide semiconductor (CMOS) circuitry. The control logic devices 218 may be configured to control various operations of other components (e.g., memory cells) of a microelectronic device (e.g., a memory device) to subsequently be formed using the additional microelectronic device structure 200 and the microelectronic device structure 100 (FIG. 1F). As a non-limiting example, the control logic devices 218 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, array multiplexers (MUX), error checking and correction (ECC) devices, self-refresh/wear leveling devices, and other chip/deck control circuitry.

With continued reference to FIG. 2A, the second contact structures 210 of the additional microelectronic device structure 200 may vertically overlie and be coupled to some of the first routing structures 206 of the control logic region 216. In some embodiments, the second contact structures 210 comprise conductively filled vias vertically extending through portions of the additional isolation material 214 interposed between the additional bond pads 212 and the first routing structures 206. The second contact structures 210 may be formed of and include conductive material. By way of non-limiting example, the second contact structures 210 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, each of the second contact structures 210 is formed of and includes Cu.

The additional bond pads 212 of the additional microelectronic device structure 200 may vertically overlie and be coupled to the second contact structures 210. The second contact structures 210 may vertically extend from and between the additional bond pads 212 and some of the first routing structures 206. The additional bond pads 212 may be configured and positioned for attachment to the bond pads 144 (FIG. 1F) of the microelectronic device structure (FIG. 1F) to form connected bond pads, as described in further detail below. The additional bond pads 212 may be formed of and include conductive material. By way of non-limiting example, the additional bond pads 212 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, each of the additional bond pads 212 is formed of and includes Cu.

Still referring to FIG. 2A, the additional isolation material 214 may cover and surround portions of at least the first routing structures 206, the second contact structures 210, and the additional bond pads 212. The additional isolation material 214 may subsequently be attached to the isolation material 146 (FIG. 1F) of the microelectronic device structure 100 (FIG. 1F) in the process of forming a microelectronic device (e.g., a memory device) using the microelectronic device structure 100 (FIG. 1F) and the additional microelectronic device structure 200, as described in further detail below. A material composition of the additional isolation material 214 may be substantially the same as a material composition of the isolation material 146 (FIG. 1F), or the material composition of the additional isolation material 214 may be different than the material composition of the isolation material 146 (FIG. 1F). In some embodiments, the additional isolation material 214 is formed of and includes at least one dielectric oxide material, such as $SiO_x$ (e.g., $SiO_2$). In additional embodiments, the additional isolation material 214 is formed of and includes at least one low-k dielectric material, such as one or more of silicon oxycarbide ($SiO_xC_y$), silicon oxynitride ($SiO_xN_y$), hydrogenated silicon oxycarbide ($SiC_xO_yH_z$), and silicon oxycarbonitride ($SiO_xC_zN_y$). The additional isolation material 214 may be substantially homogeneous, or the additional isolation material 214 may be heterogeneous. In some embodiments, the additional isolation material 214 is substantially homogeneous. In additional embodiments, the additional isolation material 214 is heterogeneous. The additional isolation material 214 may, for example, be formed of and include a stack of at least two different dielectric materials.

Figure 2B:
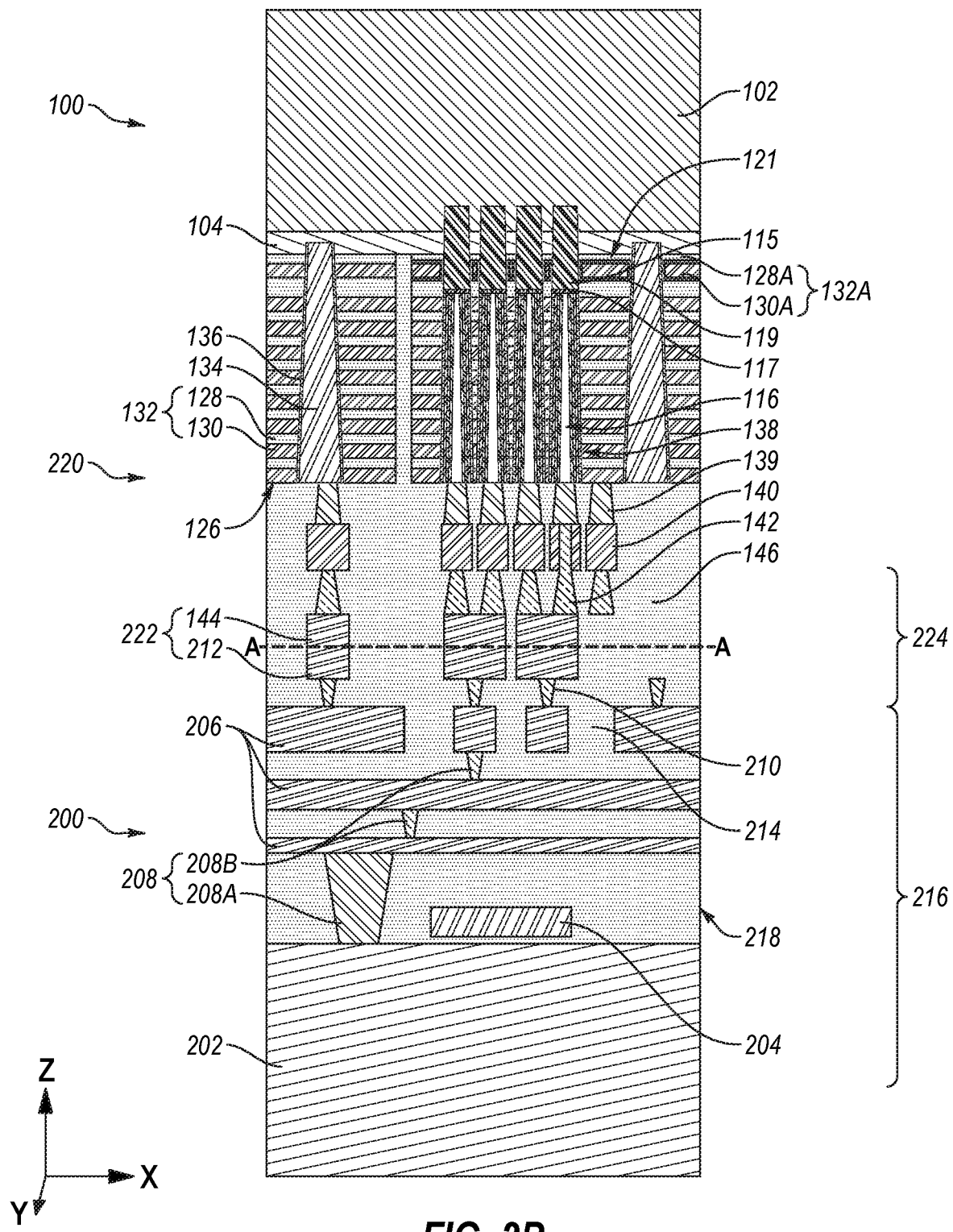

Referring to next to FIG. 2B, following the formation of the microelectronic device structure 100 and the separate formation of the additional microelectronic device structure 200, the microelectronic device structure 100 may be vertically inverted (e.g., flipped upside down in the Z-direction) and attached (e.g., bonded) to the additional microelectronic device structure 200 to form a microelectronic device structure assembly 220. Alternatively, the additional microelectronic device structure 200 may be vertically inverted (e.g., flipped upside down in the Z-direction) and attached to the microelectronic device structure 100 to form the microelectronic device structure assembly 220. The attachment of the microelectronic device structure 100 to the additional microelectronic device structure 200 may attach the bond pads 144 of the microelectronic device structure 100 to the additional bond pads 212 of the additional microelectronic device structure 200 to form connected bond pads 222. In addition, the attachment of the microelectronic device structure 100 to the additional microelectronic device structure 200 may also attach the isolation material 146 of the microelectronic device structure 100 to the additional isolation material 214 of the additional microelectronic device structure 200. As shown in FIG. 2B, the attachment of the microelectronic device structure 100 to the additional microelectronic device structure 200 may form a first interconnect region 224 of a microelectronic device (e.g., memory device, such as a 3D NAND Flash memory device) to subsequently be formed using the microelectronic device structure assembly 220. In FIG. 2B, vertical boundaries of the microelectronic device structure 100 relative to the additional microelectronic device structure 200 prior to the attachment of the microelectronic device structure 100 to the additional microelectronic device structure 200 to form the microelectronic device structure assembly 220 are depicted by the dashed line A-A. The microelectronic device structure 100 may be attached to the additional microelectronic device structure 200 without a bond line.

As shown in FIG. 2B, the connected bond pads 222 of the first interconnect region 224 may vertically extend from and between the digit line contact structures 142 of the microelectronic device structure 100 and the second contact structures 210 of the additional microelectronic device structure 200. The additional bond pads 212 of the connected bond pads 222 may vertically extend from and between the second contact structures 210 and the bond pads 144 of the connected bond pads 222; and the bond pads 144 of the connected bond pads 222 may vertically extend from and between the digit line contact structures 142 and the additional bond pads 212 of the connected bond pads 222. While in FIG. 2B, the additional bond pad 212 and the bond pad 144 of each connected bond pad 222 are distinguished from one another by way of a dashed line, the additional bond pad 212 and the bond pad 144 may be integral and continuous with one another. Put another way, each connected bond pad 222 may be a substantially monolithic structure including the additional bond pad 212 as a first region thereof, and the bond pad 144 as a second region thereof. For each connected bond pad 222, the additional bond pad 212 thereof may be attached to the bond pad 144 thereof without a bond line.

Figure 2C:
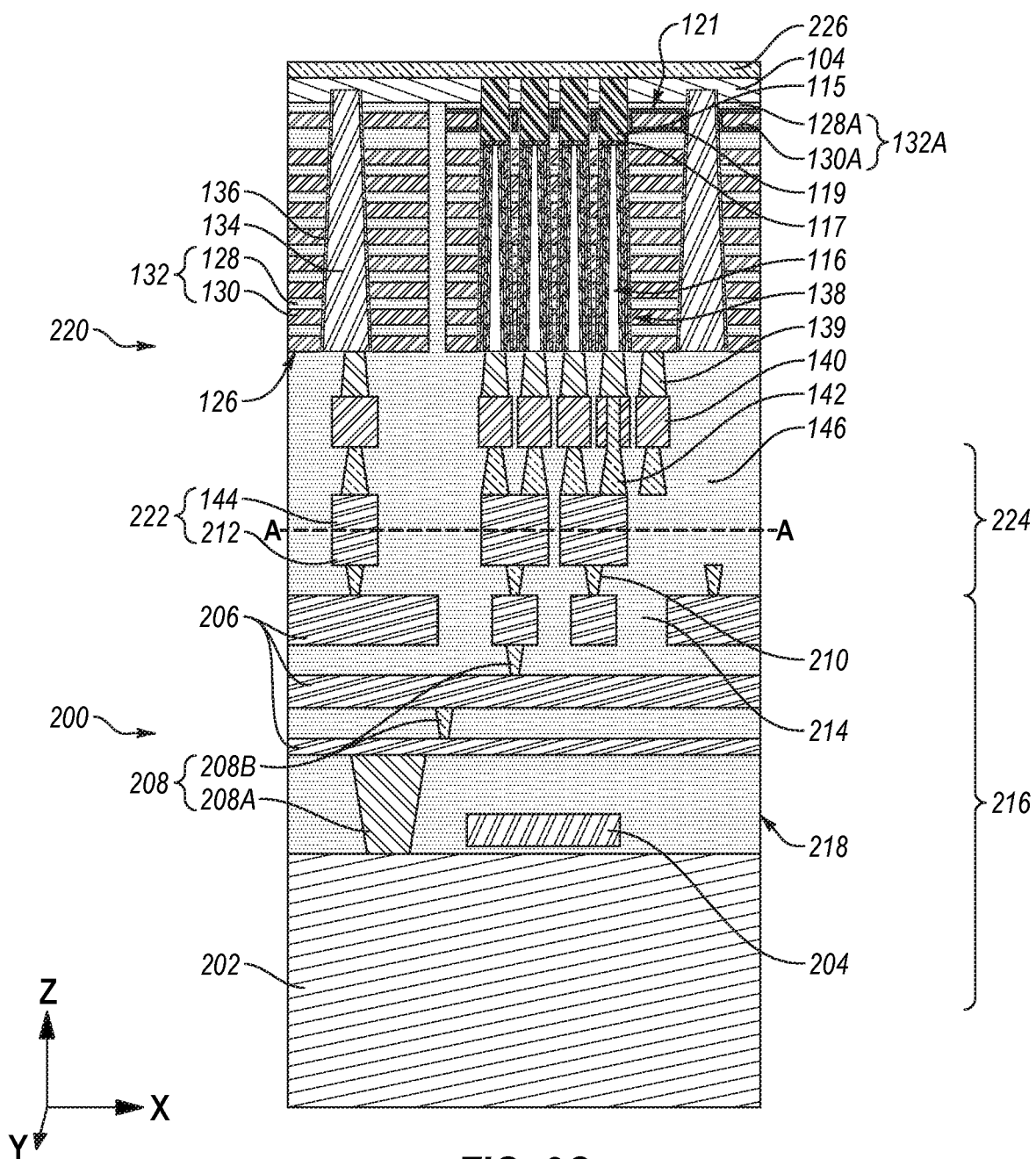

Referring next to FIG. 2C, after attaching the microelectronic device structure 100 (FIG. 2B) to the additional microelectronic device structure 200, the base structure 102 (FIG. 2B) and portions of the semiconductive structures 115 may be removed (e.g., through conventional detachment processes and/or conventional grinding processes). The material removal process may expose (e.g., uncover) the doped semiconductive material 104 and remaining portions of the semiconductive structures 115. As shown in FIG. 2C, an upper surface of the doped semiconductive material 104 may be substantially coplanar with upper surfaces of remaining portions of the semiconductive structures 115. The upper surfaces of the doped semiconductive material 104 and the remaining portions of the semiconductive structures 115 may vertically overlie upper surfaces of the cell pillar structures 116. In addition, optionally, an additional amount (e.g., additional volume) of doped semiconductive material (e.g., doped polycrystalline silicon) may be formed on the doped semiconductive material 104 and the remaining portions of the semiconductive structures 115 following the removal of the base structure 102 (FIG. 2B) and the portions of the semiconductive structures 115. If formed, the additional amount of doped semiconductive material may have substantially the same material composition as that of the doped semiconductive material 104, or may have a different material composition than that of the doped semiconductive material 104. In addition, optionally, a strapping material 226 may optionally be formed on or over the doped semiconductive material 104 and the remaining portions of the semiconductive structures 115. The doped semiconductive material 104 (and the additional amount of doped semiconductive material, if any) may, optionally, be annealed (e.g., thermally annealed) before and/or after the formation of the strapping material 226 (if any). Annealing the doped semiconductive material 104 (and the additional amount of doped semiconductive material, if any) may, for example, facilitate or enhance dopant activation within the doped semiconductive material 104 (and the additional amount of doped semiconductive material, if any).

If formed, the strapping material 226 may be formed of and include conductive material. By way of non-limiting example, the strapping material 226 (if any) may be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the strapping material 226 is formed of and includes tungsten silicide (WSi$_x$). In additional embodiments, the strapping material 226 is formed of and include one or more of (e.g., a stack of) W and tungsten nitride (WN$_x$).

Figure 2D:
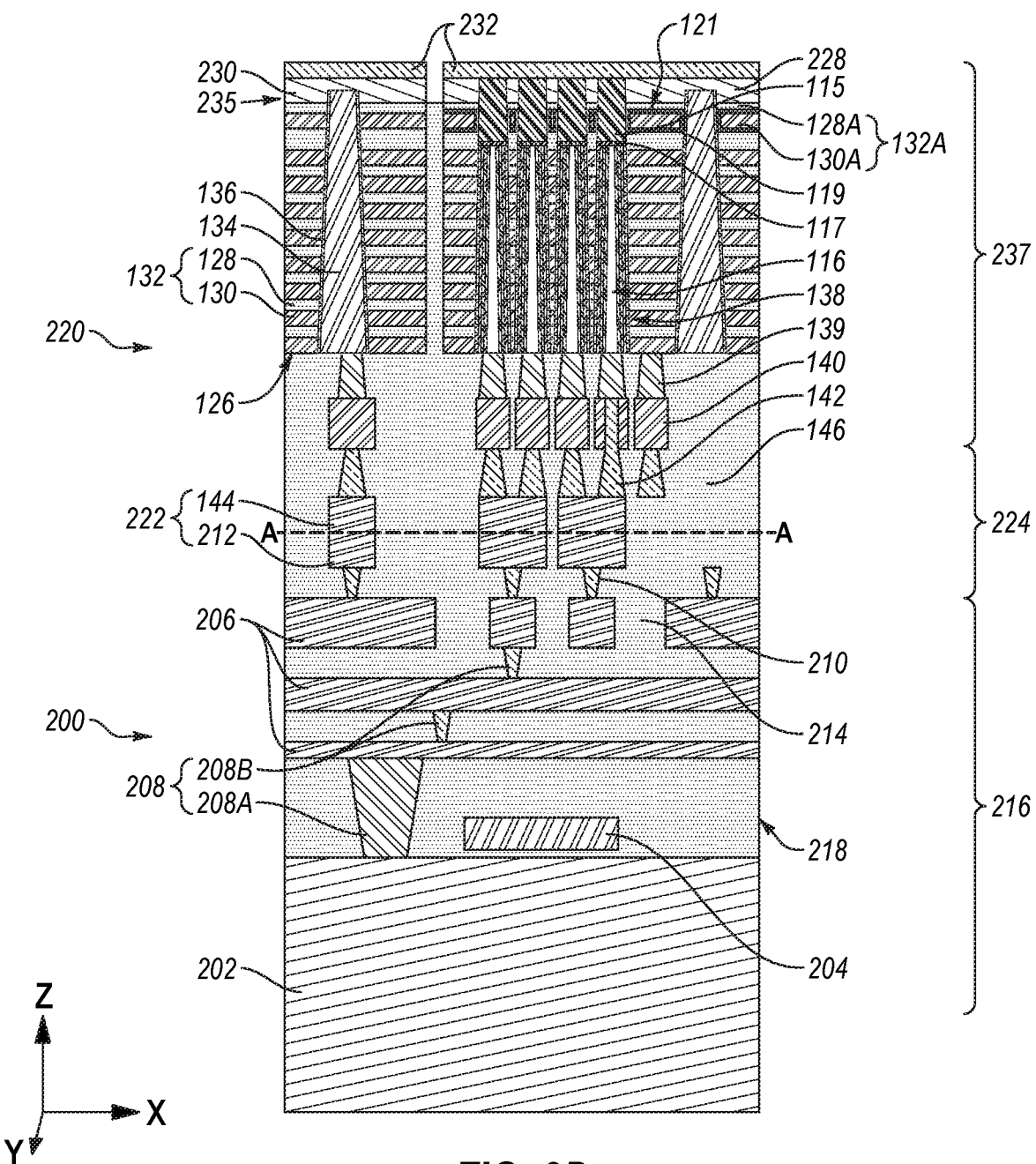

Referring next to FIG. 2D, following the removal of the base structure 102 (FIG. 2B), regions of the doped semiconductive material 104 (and the additional amount of doped semiconductive material, if any) (FIG. 2C) and the strapping material 226 (FIG. 2C) (if any) may be removed (e.g., etched) to form one or more source structures 228 and one or more contact pads 230 from the doped semiconductive material 104 (FIG. 2C), and to from form strapping structures 232 from the strapping material 226 (FIG. 2C) (if any). As shown in FIG. 2D, the formation of the source structure(s) 228 and the contact pad(s) 230 may form a memory array region 237 of a microelectronic device (e.g., memory device) to subsequently be formed using the microelectronic device structure assembly 220. The memory array region 237 may include the stack structure 126; the cell pillar structures 116; the deep contact structures 134; the digit line structures 139; the insulative line structures 140; portions (e.g., the second portions 142B (FIG. 1F)) of the digit line contact structures 142; and a source tier 235 including the source structure(s) 228, the contact pad(s) 230, and the strapping structures 232 (if any).

Within the source tier 235 of the memory array region 237, the source structure(s) 228 and the contact pad(s) 230 may horizontally neighbor one another (e.g., in the X-direction, in the Y-direction). The source structure(s) 228 may be electrically isolated from the contact pad(s) 230, and may be positioned at substantially the same vertical position (e.g., in the Z-direction) as the contact pad(s) 230. The source structure(s) 228 may be coupled to the vertically extending strings of memory cells 138. The contact pad(s) 230 may be coupled to additional conductive features within the stack structure 126, such as one or more of the deep contact structures 134.

The processing acts described above with respect to FIGS. 1A through 1F and FIGS. 2A through 2C effectuate the formation of the source structure(s) 228, the contact pad(s) 230, and the strapping structures 232 (if any) after (e.g., subsequent to, following) the formation of other features of the memory array region 237, and after the attachment of the microelectronic device structure 100 (FIG. 2B) to the additional microelectronic device structure 200.

Figure 2E:
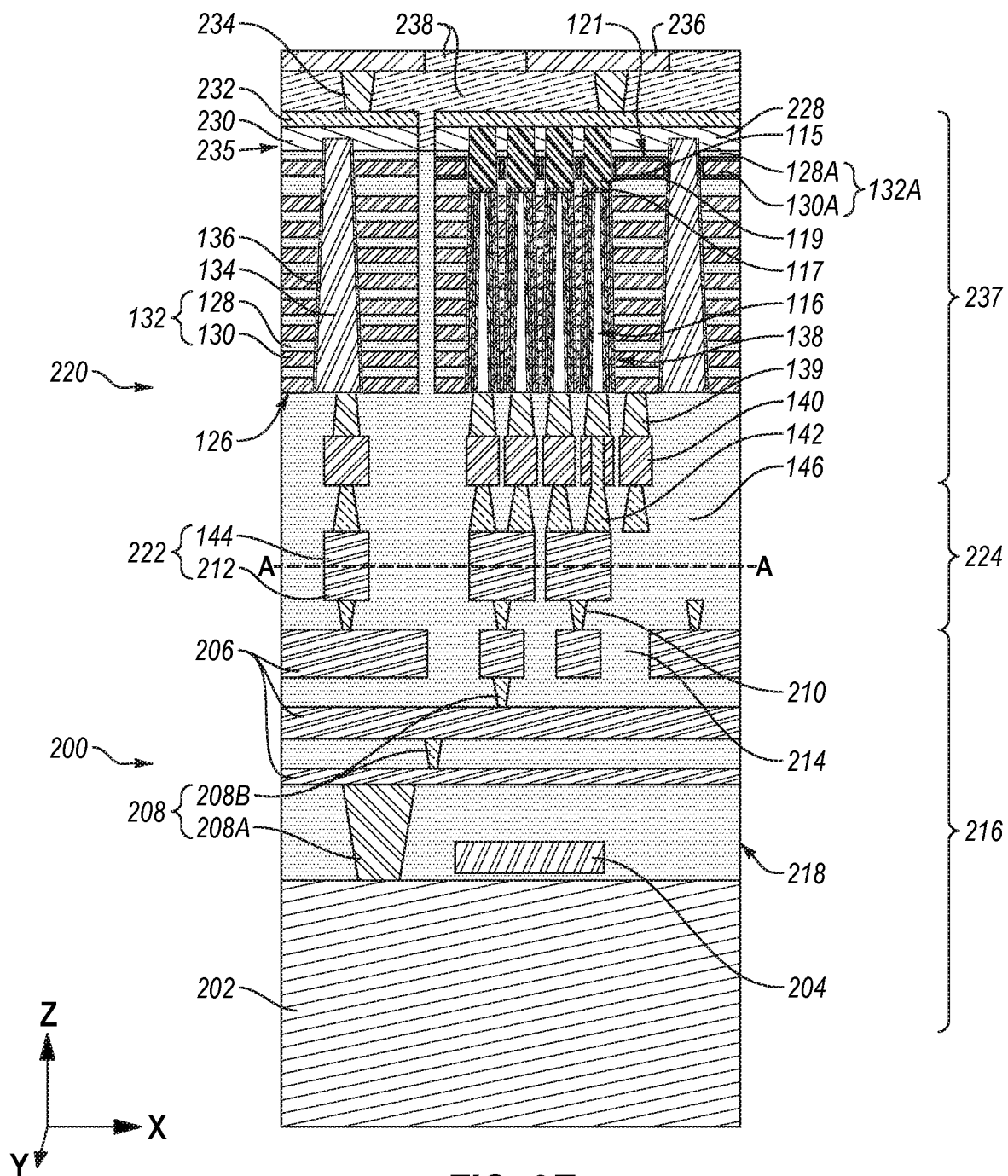

Referring next to FIG. 2E, third contact structures 234 may be formed over and in electrical communication with the source structure(s) 228 and the contact pad(s) 230, and second routing structures 236 may be formed over and in electrical communication with the third contact structures 234. The third contact structures 234 may be formed to extend between the second routing structures 236 and the source structure(s) 228 and the contact pad(s) 230 of the source tier 235. If present, the strapping structures 232 may vertically intervene between the third contact structures 234 and the source structure(s) 228 and the contact pad(s) 230. The third contact structures 234 may, for example, be formed on upper surfaces of the strapping structures 232. In addition, as shown in FIG. 2E, at least one insulative material 238 may be formed to cover and surround the third contact structures 234 and the second routing structures 236. The at least one insulative material 238 may also be formed to cover and surround portions of the source structure(s) 228 and the contact pad(s) 230.

The third contact structures 234 and the second routing structures 236 may each be formed of and include conductive material. By way of non-limiting example, the third contact structures 234 and the second routing structures 236 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the third contact structures 234 and the second routing structures 236 are each formed of and include Cu. In additional embodiments, the third contact structures 234 are formed of and include W, and the second routing structures 236 are formed of and include Cu.

Still referring to FIG. 2E, in some embodiments, the insulative material 238 is formed of and includes at least one dielectric oxide material, such as $SiO_x$ (e.g., $SiO_2$). In additional embodiments, the insulative material 238 is formed of and includes at least one low-k dielectric material, such as one or more of $SiO_xC_y$, $SiO_xN_y$, $SiC_xO_yH_z$, and $SiO_xC_zN_y$. The insulative material 238 may be substantially homogeneous, or the insulative material 238 may be heterogeneous. If the insulative material 238 is heterogeneous, amounts of one or more elements included in the insulative material 238 may vary stepwise (e.g., change abruptly), or may vary continuously (e.g., change progressively, such as linearly, parabolically) throughout different portions of the insulative material 238. In some embodiments, the insulative material 238 is substantially homogeneous. In additional embodiments, the insulative material 238 is heterogeneous. The insulative material 238, for example, be formed of and include a stack of at least two different dielectric materials.

Figure 2F:
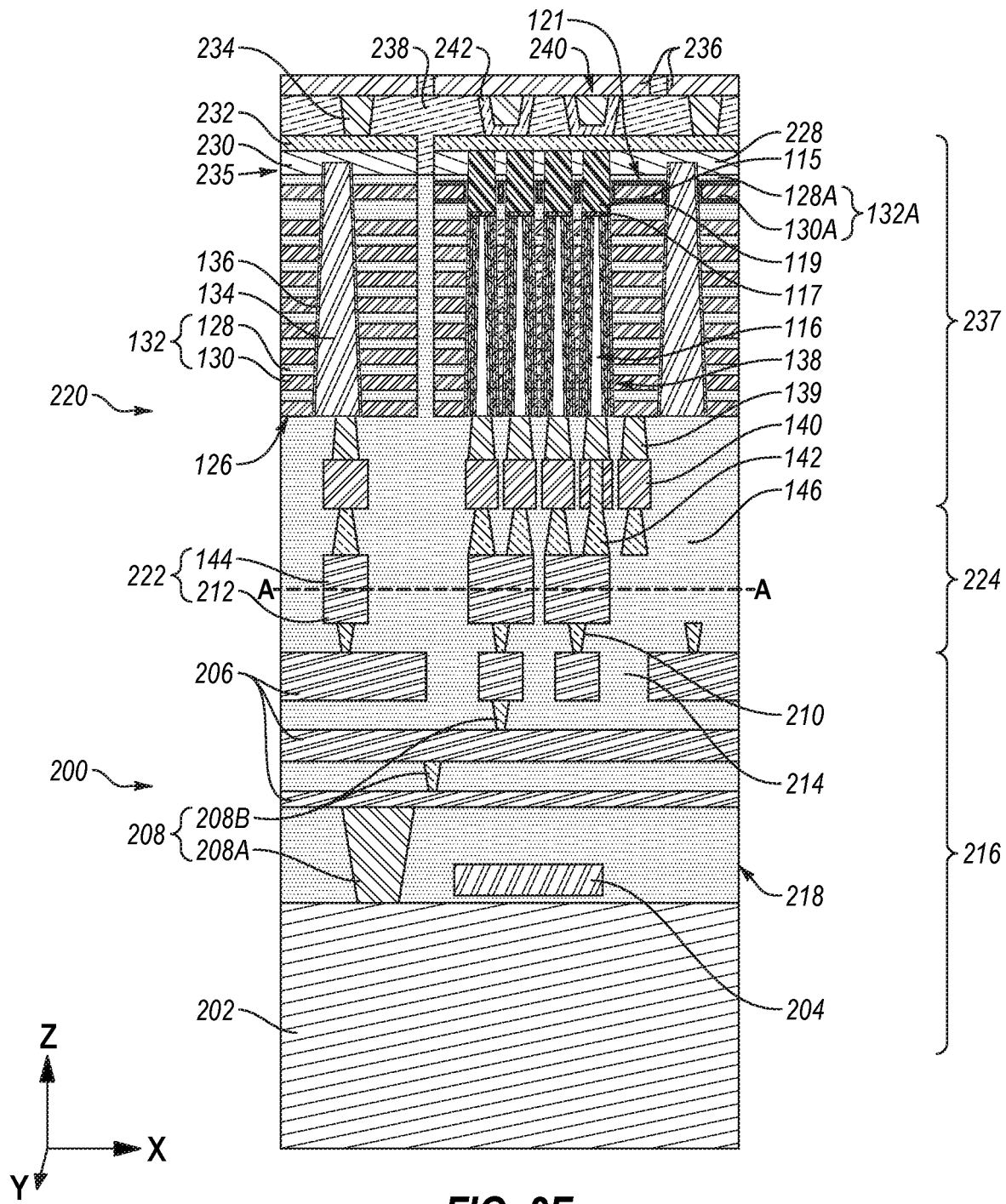
Figure 2G:
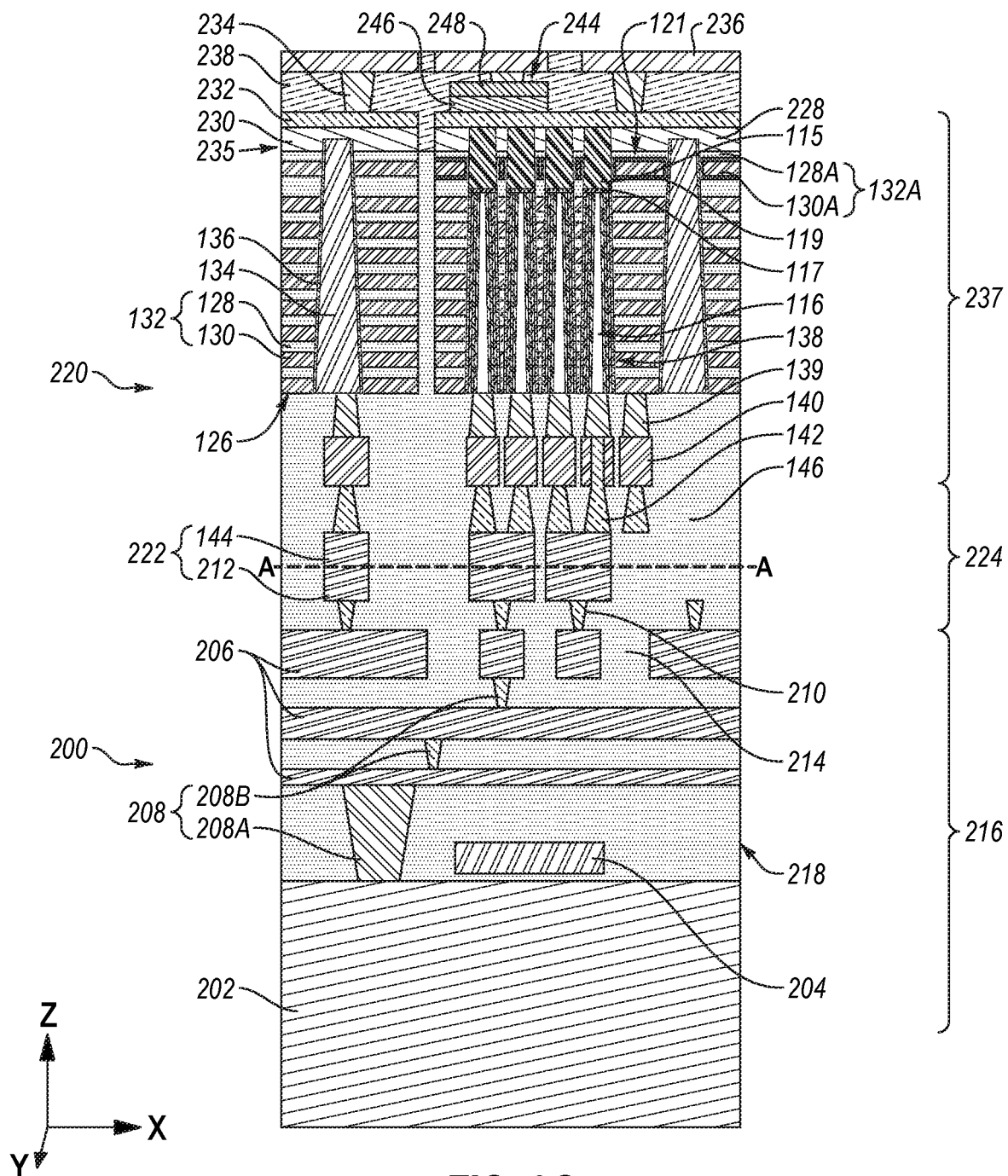

In additional embodiments, one or more capacitors (e.g., one or more metal-insulator-metal (MIM) capacitors; one or more metal-insulator-semiconductor (MIS) capacitors) may be formed at the processing stage described above with reference to FIG. 2E. By way of non-limiting example, FIGS. 2F and 2G are simplified, partial cross-sectional views illustrating embodiments of the disclosure wherein capacitors are formed over the source tier 235 previously described with reference to FIG. 2D. FIG. 2F shows an embodiment of the disclosure wherein one or more MIM capacitors are formed over the source tier 235. FIG. 2G shows an embodiment of the disclosure wherein one or more MIS capacitors are formed over the source tier 235.

Referring to FIG. 2F, in some embodiments, one or more MIM capacitors 240 are formed over the source tier 235. An individual MIM capacitor 240 may include a portion of an individual strapping structure 232, an insulative structure 242 on or over the strapping structure 232, and an individual third contact structure 234 on or over the insulative structure 242. The portion of the strapping structure 232 may serve a first metal structure of the MIM capacitor 240, the third contact structure 234 may serve as a second metal structure of the MIM capacitor 240, and the insulative structure 242 may intervene between the strapping structure 232 and the third contact structure 234. As shown in FIG. 2F, for an individual MIM capacitor 240, the insulative structure 242 thereof may be positioned directly adjacent a lower surface and side surfaces of the third contact structure 234. The insulative structure 242 may be interposed between the lower surface of the third contact structure 234 and an upper surface of a strapping structure 232 associated with the MIM capacitor 240, and may also be interposed between the side surfaces of the third contact structure 234 and side surfaces of the insulative material 238 horizontally surrounding the third contact structures 234. In additional embodiments, a metallic structure (e.g., a metal structure, an alloy structure) is formed between the strapping structure 232 and the insulative structure 242, and serves as the first metal structure of the MIM capacitor 240.

The insulative structure 242 of an individual MIM capacitor 240 may be formed of and include insulative material. For example, the insulative structure 242 may be formed of and include at least one dielectric oxide material, such as one or more of $SiO_x$; phosphosilicate glass; borosilicate glass; borophosphosilicate glass; fluorosilicate glass; $AlO_x$; and a high-k oxide, such one or more of $HfO_x$, $NbO_x$, and $TiO_x$. In some embodiments, the insulative structure 242 is formed of and includes at least one high-k oxide (e.g., one or more of $HfO_x$, $NbO_x$, and $TiO_x$). In additional embodiments, the insulative structure 242 is formed of and includes $SiO_x$ (e.g., $SiO_2$).

The MIM capacitor(s) 240 may be formed using conventional processes (e.g., conventional material deposition processes, conventional material removal processes, such as conventional etching processes) and conventional processing equipment, which are not described in detail herein. One or more masks (e.g., one or more i-line masks) may be employed to protect insulative material (e.g., high-k oxide) of the insulative structure(s) 242 during patterning and etching processes employed to form the MIM capacitor(s) 240.

Referring next to FIG. 2G, in additional embodiments, one or more MIS capacitors 244 are formed over the source tier 235. An individual MIS capacitor 244 may include a portion of an individual source structure 228, an insulative structure 246 on or over the source structure 228, and a metallic structure 248 on or over the insulative structure 246. The metallic structure 248 may serve as a metal structure of the MIS capacitor 244, the portion of the source structure 228 may serve a semiconductive structure (e.g., a conductively doped semiconductive structure) of the MIS capacitor 244, and the insulative structure 246 may intervene between the source structure 228 and the metallic structure 248. As shown in FIG. 2G, for an individual MIS capacitor 244, the insulative structure 246 thereof may be interposed between a lower surface of the metallic structure 248 and an upper surface of the source structure 228 associated with the MIS capacitor 244. As shown in FIG. 2G, the strapping structure 232 (FIG. 2E) may not be positioned vertically between and in contact with the source structure 228 and the insulative structure 246 of the MIS capacitor 244. In some such embodiments, the strapping structures 232 are omitted (e.g., absent) from upper surfaces of the source structure(s) 228 and the contact pad(s) 230 of the source tier 235. In additional embodiments, strapping structures 232 are formed over portions of the upper surfaces of the source structure(s) 228 and the contact pad(s) 230 outside of horizontal boundaries of the MIS capacitor(s) 244, but are omitted from other portions of upper surfaces of the source structure(s) 228 within horizontal boundaries the MIS capacitor(s) 244.

The insulative structure 246 of an individual MIS capacitor 244 may be formed of and include insulative material. For example, the insulative structure 246 may be formed of and include at least one dielectric oxide material, such as one or more of $SiO_x$; phosphosilicate glass; borosilicate glass; borophosphosilicate glass; fluorosilicate glass; $AlO_x$; and a high-k oxide, such one or more of $HfO_x$, $NbO_x$, and $TiO_x$. In some embodiments, the insulative structure 246 is formed of and includes at least one high-k oxide (e.g., one or more of $HfO_x$, $NbO_x$, and $TiO_x$). In additional embodiments, the insulative structure 246 is formed of and includes $SiO_x$ (e.g., $SiO_2$).

Still referring to FIG. 2G, the metallic structure 248 of an individual MIS capacitor 244 may be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the metallic structure 248 of one or more MIS capacitors 244 is formed of and includes W.

The MIS capacitor(s) 244 may be formed using conventional processes (e.g., conventional material deposition processes, conventional material removal processes, such as conventional etching processes) and conventional processing equipment, which are not described in detail herein. One or more masks (e.g., one or more i-line masks) may be employed to protect insulative material (e.g., high-k oxide) of the insulative structure(s) 246 during patterning and etching processes employed to form the MIS capacitor(s) 244.

Figure 2H:
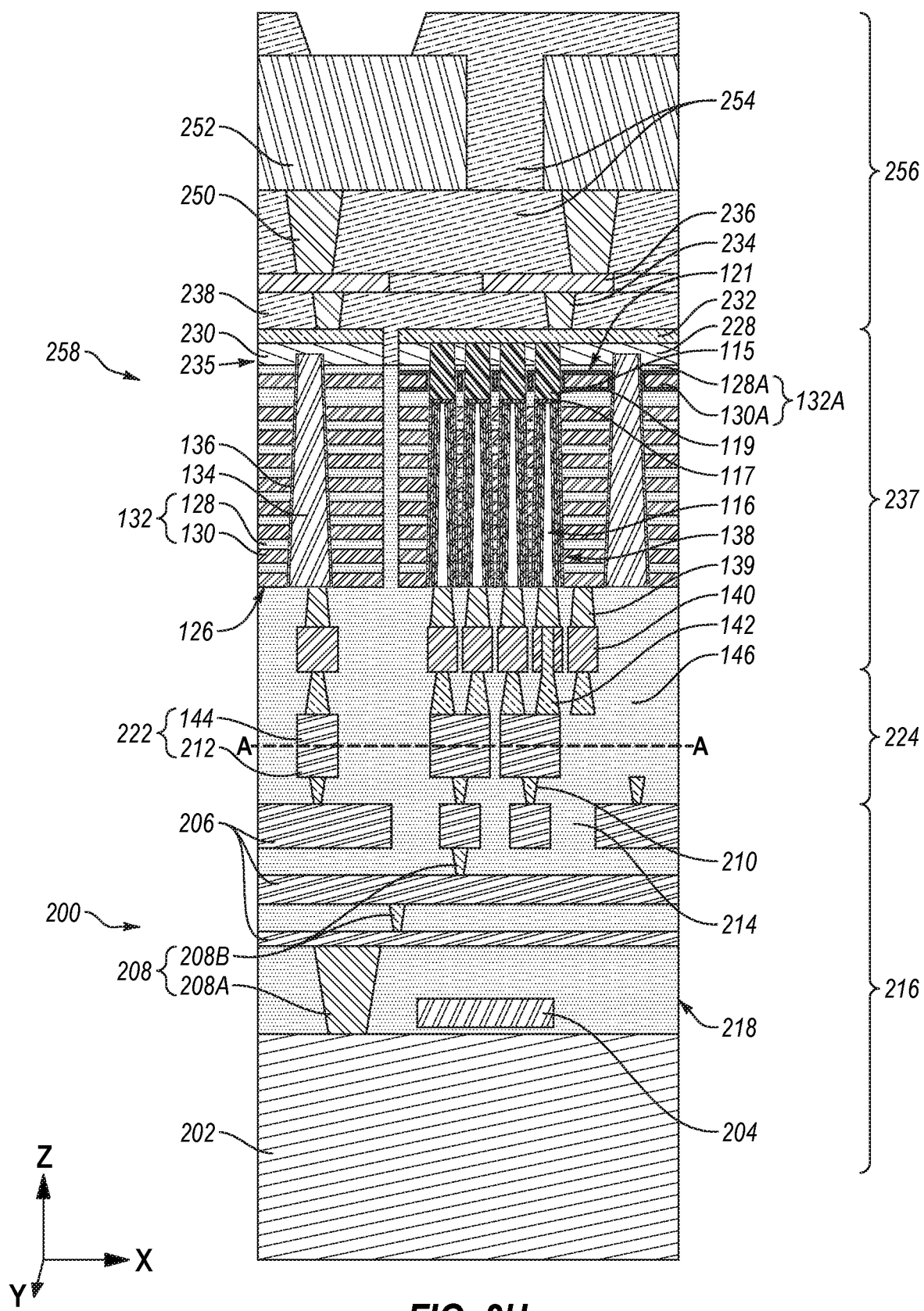

With returned reference to FIG. 2E, following the formation of the second routing structures 236, the microelectronic device structure assembly 220 may be subjected to additional processing to couple additional features to the second routing structures 236. For example, referring to FIG. 2H, fourth contact structures 250 may be formed over and in electrical communication with the second routing structures 236, and conductive pads 252 may be formed over and in electrical communication with the fourth contact structures 250. The fourth contact structures 250 may be formed to extend between the second routing structures 236 and the conductive pads 252. The fourth contact structures 250 may, for example, be formed on upper surfaces of the second routing structures 236, and the conductive pads 252 may be formed on upper surfaces of the fourth contact structures 250. In addition, as shown in FIG. 2H, at least one additional insulative material 254 may be formed to cover and surround the fourth contact structures 250 and the conductive pads 252. The at least one additional insulative material 254 may also be formed to cover and surround portions of the second routing structures 236 and the insulative material 238.

The fourth contact structures 250 and the conductive pads 252 may each be formed of and include conductive material. By way of non-limiting example, the fourth contact structures 250 and the conductive pads 252 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the fourth contact structures 250 are formed of and include W, and the conductive pads 252 are formed of and include Al.

Still referring to FIG. 2H, a material composition of the additional insulative material 254 may be substantially the same as a material composition of the insulative material 238, or a material composition of the additional insulative material 254 may be different than a material composition of the insulative material 238. In some embodiments, the additional insulative material 254 is formed of and includes at least one dielectric oxide material, such as $SiO_x$ (e.g., $SiO_2$). In additional embodiments, the additional insulative material 254 is formed of and includes at least one low-k dielectric material, such as one or more of $SiO_xC_y$, $SiO_xN_y$, $SiC_xO_yH_z$, and $SiO_xC_zN_y$. The additional insulative material 254 may be substantially homogeneous, or the additional insulative material 254 may be heterogeneous. If the additional insulative material 254 is heterogeneous, amounts of one or more elements included in the additional insulative material 254 may vary stepwise (e.g., change abruptly), or may vary continuously (e.g., change progressively, such as linearly, parabolically) throughout different portions of the additional insulative material 254. In some embodiments, the additional insulative material 254 is substantially homogeneous. In additional embodiments, the additional insulative material 254 is heterogeneous. The additional insulative material 254, for example, be formed of and include a stack of at least two different dielectric materials.

As shown in FIG. 2H, the formation of the fourth contact structures 250, the conductive pads 252, and the additional insulative material 254 may form a second interconnect region 256. The second interconnect region 256 may include the third contact structures 234, the second routing structures 236, the insulative material 238, the fourth contact structures 250, the conductive pads 252, and the additional insulative material 254. In addition, the formation of the second interconnect region 256 may effectuate the formation of a microelectronic device 258 (e.g., a memory device, such as a 3D NAND Flash memory device). The microelectronic device 258 may include the control logic region 216, the first interconnect region 224, the memory array region 237, and the second interconnect region 256. At least the second routing structures 236 and the conductive pads 252 of the second interconnect region 256 may serve as global routing structures for the microelectronic device 258. The second routing structures 236 and the conductive pads 252 may, for example, be configured to receive global signals from an external bus, and to relay the global signals to other components (e.g., structures, devices) of the microelectronic device 258.

Thus, in accordance with embodiments of the disclosure, a method of forming a microelectronic device comprises forming a microelectronic device structure. The microelectronic device structure comprises a base structure; a doped semiconductive material overlying the base structure; a stack structure overlying the doped semiconductive material and comprising a vertically alternating sequence of conductive structures and insulative structures; semiconductive structures vertically extending from locations within the base structure, through the doped semiconductive structure, and into a lower portion of the stack structure; cell pillar structures vertically overlying and horizontally aligned with the semiconductive structures, the cell pillar structures vertically extending through an upper portion of the stack structure; and digit line structures vertically overlying the stack structure. An additional microelectronic device structure comprising control logic devices is formed. The microelectronic device structure is attached to the additional microelectronic device structure to form a microelectronic device structure assembly. The digit line structures are vertically interposed between the stack structure and the control logic devices within the microelectronic device structure assembly. The base structure and portions of the semiconductive structures are removed to expose the doped semiconductive material and additional portions of the semiconductive structures. The doped semiconductive material is patterned after removing the base structure and the portions of the semiconductive structures to form at least one source structure over the stack structure and coupled to the cell pillar structures.

Furthermore, in accordance with embodiments of the disclosure, a microelectronic device comprises a memory array region, a control logic region, a first interconnect region, and a second interconnect region. The memory array region comprises a stack structure comprising a vertically alternating sequence of conductive structures and insulating structures; a source structure vertically overlying the stack structure and comprising a doped semiconductive material; semiconductive structures vertically extending through the source structure and into an upper portion of the stack structure; cell pillar structures vertically underlying and horizontally aligned with the semiconductive structures, the cell pillar structures vertically extending through a lower portion of the stack structure; and digit line structures vertically underlying the stack structure and in electrical communication with the cell pillar structures. The control logic region comprises control logic devices. The first interconnect region is vertically interposed between the memory array region and the control logic region and comprises additional conductive structures coupling the digit line structures of the memory array region to the control logic devices of the control logic region. The second interconnect region vertically overlies the memory array region and comprises further conductive structures in electrical communication with the source structure.

Microelectronic devices (e.g., microelectronic device 258 (FIG. 2H)) in accordance with embodiments of the disclosure may be used in embodiments of electronic systems of the disclosure. For example, FIG. 3 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an IPAD® or SURFACE® tablet, an electronic book, a navigation device, etc. The electronic system 300 includes at least one memory device 302. The memory device 302 may comprise, for example, a microelectronic device (e.g., the microelectronic device 258 (FIG. 2H)) previously described herein. The electronic system 300 may further include at least one electronic signal processor device 304 (often referred to as a "microprocessor"). The electronic signal processor device 304 may, optionally, include a microelectronic device (e.g., the microelectronic device 258 (FIG. 2H)) previously described herein. While the memory device 302 and the electronic signal processor device 304 are depicted as two (2) separate devices in FIG. 2A, in additional embodiments, a single (e.g., only one) memory/processor device having the functionalities of the memory device 302 and the electronic signal processor device 304 is included in the electronic system 300. In such embodiments, the memory/processor device may include a microelectronic device (e.g., the microelectronic device 258 (FIG. 2H)) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably coupled to the input device and the output device, and a memory device operably coupled to the processor device. The memory device comprises a stack structure, a source structure, digit line structures, semiconductive structures, cell pillar structures, conductive routing structures, control logic devices, and additional conductive routing structures. The stack structure comprises tiers each comprising a conductive structure and an insulative structure vertically neighboring the conductive structure. The source structure overlies the stack structure. The digit line structures underlie the stack structure. The semiconductive structures vertically extend through the source structure and at least an uppermost tier of the tiers of the stack structure. The cell pillar structures are coupled to the semiconductive structures and the digit line structures and vertically extend through at least one additional tier of the tiers of the stack structure vertically underlying the uppermost tier. The conductive routing structures vertically underlie and are coupled to the digit line structures. The control logic devices are coupled to and at least partially vertically underlie the conductive routing structures. The additional conductive routing structures are coupled to and vertically overlie the source structure.

The structures, devices, and methods of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures, devices, and methods of the disclosure may also improve scalability, efficiency, and simplicity as compared to conventional structures, conventional devices, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A method of forming a microelectronic device, comprising:
forming a microelectronic device structure comprising:
a base structure;
a doped semiconductive material overlying the base structure;
a stack structure overlying the doped semiconductive material and comprising a vertically alternating sequence of conductive structures and insulative structures;
semiconductive structures vertically extending from locations within the base structure, through the doped semiconductive material, and into a lower portion of the stack structure;
cell pillar structures vertically overlying and horizontally aligned with the semiconductive structures, the cell pillar structures vertically extending through an upper portion of the stack structure; and
digit line structures vertically overlying the stack structure;
forming an additional microelectronic device structure comprising control logic devices;
attaching the microelectronic device structure to the additional microelectronic device structure to form a microelectronic device structure assembly, the digit line structures vertically interposed between the stack structure and the control logic devices within the microelectronic device structure assembly;
removing the base structure and portions of the semiconductive structures to expose the doped semiconductive material and additional portions of the semiconductive structures; and
patterning the doped semiconductive material after removing the base structure and the portions of the semiconductive structures to form at least one source structure over the stack structure and coupled to the cell pillar structures.

2. The method of claim 1, wherein forming the microelectronic device structure comprises:
forming a preliminary stack structure over the doped semiconductive material, the preliminary stack structure comprising a vertically alternating sequence of first insulative structures and second insulative structures;
forming openings vertically extending through the preliminary stack structure and the doped semiconductive material and into the base structure;
filling lower portions of the openings positioned within the base structure, the doped semiconductive material, and the lower portion of the stack structure with epitaxial semiconductive material;
forming the cell pillar structures over the epitaxial semiconductive material and within remaining, upper portions of the openings;
forming slots extending through the preliminary stack structure;
at least partially replacing the second insulative structures with the conductive structures using the slots to form the stack structure, the insulative structures of the stack structure comprising remaining portions of the first insulative structures; and
forming the digit line structures over and in electrical communication with the cell pillar structures.

3. The method of claim 2, further comprising forming additional doped semiconductive material between the epitaxial semiconductive material and the cell pillar structures within the openings.

4. The method of claim 2, further comprising forming a gate dielectric material around the conductive structures, the gate dielectric material interposed between a first conductive structure of the conductive structures and the epitaxial semiconductive material within the lower portion of the stack structure.

5. The method of claim 4, further comprising selecting the gate dielectric material to comprise a dielectric oxide material.

6. The method of claim 1, wherein forming the microelectronic device structure comprises forming the microelectronic device structure to further comprise metal-oxide-semiconductor (MOS) select devices within the lower portion of the stack structure.

7. The method of claim 1, wherein forming the microelectronic device structure comprises forming the microelectronic device structure to further comprise conductive contact structures vertically extending through the stack structure and into the doped semiconductive material.

8. The method of claim 1, wherein forming the microelectronic device structure comprises forming the microelectronic device structure to further comprise:
insulative line structures on the digit line structures;
digit line contact structures extending through portions of the insulative line structures and contacting the digit line structures; and
conductive pad structures on the digit line contact structures.

9. The method of claim 8, wherein forming the additional microelectronic device structure comprises forming the microelectronic device structure to further comprise additional conductive pad structures over the control logic devices.

10. The method of claim 9, wherein attaching the microelectronic device structure to the additional microelectronic device structure comprises:
vertically inverting one of the microelectronic device structure and the additional microelectronic device structure; and
bonding the conductive pad structures of the microelectronic device structure to the additional conductive pad structures of the additional microelectronic device structure.

11. The method of claim 1, further comprising:
forming conductive routing structures over and in electrical communication with the at least one source structure; and
forming conductive pad structures over and in electrical communication with the conductive routing structures.

12. The method of claim 11, further comprising forming, vertically over the at least one the source structure and vertically under the conductive routing structures, one or more of at least one metal-insulator-metal (MIM) capacitor and at least one metal-insulator-semiconductor (MIS) capacitor.

13. A microelectronic device, comprising:
a memory array region comprising:
a stack structure comprising a vertically alternating sequence of conductive structures and insulating structures;
a source structure vertically overlying the stack structure and comprising a doped semiconductive material;
semiconductive structures comprising epitaxial semiconductive material vertically extending through the source structure and into an upper portion of the stack structure;

cell pillar structures vertically underlying and horizontally aligned with the semiconductive structures, the cell pillar structures vertically extending through a lower portion of the stack structure; and digit line structures vertically underlying the stack structure and in electrical communication with the cell pillar structures;

a control logic region comprising control logic devices;

a first interconnect region vertically interposed between the memory array region and the control logic region and comprising additional conductive structures coupling the digit line structures of the memory array region to the control logic devices of the control logic region; and a second interconnect region vertically overlying the memory array region and comprising further conductive structures in electrical communication with the source structure.

14. The microelectronic device of claim 13, further comprising metal-oxide-semiconductor (MOS) select devices within the upper portion of the stack structure.

15. The microelectronic device of claim 13, further comprising a metal-insulator-metal (MIM) capacitor at least partially positioned vertically between the source structure and the further conductive structures.

16. The microelectronic device of claim 13, further comprising a metal-insulator-semiconductor (MIS) capacitor at least partially positioned vertically between the source structure and the further conductive structures.

17. A microelectronic device, comprising:
a memory array region comprising:
a stack structure comprising a vertically alternating sequence of conductive structures and insulating structures;
a source structure vertically overlying the stack structure and comprising a doped semiconductive material;
semiconductive structures vertically extending through the source structure and into an upper portion of the stack structure;
cell pillar structures vertically underlying and horizontally aligned with the semiconductive structures, the cell pillar structures vertically extending through a lower portion of the stack structure;
additional doped semiconductive material vertically interposed between the semiconductive structures and the cell pillar structures;
gate dielectric material horizontally interposed between semiconductive structures and one or more of the conductive structures; and
digit line structures vertically underlying the stack structure and in electrical communication with the cell pillar structures;
a control logic region comprising control logic devices;
a first interconnect region vertically interposed between the memory array region and the control logic region and comprising additional conductive structures coupling the digit line structures of the memory array region to the control logic devices of the control logic region; and
a second interconnect region vertically overlying the memory array region and comprising further conductive structures in electrical communication with the source structure.

18. A microelectronic device, comprising:
a memory array region comprising:
a stack structure comprising a vertically alternating sequence of conductive structures and insulating structures;
a source structure vertically overlying the stack structure and comprising a doped semiconductive material;
semiconductive structures vertically extending through the source structure and into an upper portion of the stack structure;
cell pillar structures vertically underlying and horizontally aligned with the semiconductive structures, the cell pillar structures vertically extending through a lower portion of the stack structure; and
digit line structures vertically underlying the stack structure and in electrical communication with the cell pillar structures;
a control logic region comprising control logic devices;
a first interconnect region vertically interposed between the memory array region and the control logic region and comprising additional conductive structures coupling the digit line structures of the memory array region to the control logic devices of the control logic region; and
a second interconnect region vertically overlying the memory array region and comprising further conductive structures in electrical communication with the source structure, the further conductive structures comprising:
conductive routing structures over the source structure;
conductive contacts extending between and coupling the conductive routing structures and the source structure;
conductive pad structures over the conductive routing structures; and
additional conductive contacts extending between and coupling the conductive routing structures and the conductive pad structures.

19. An electronic system, comprising:
an input device;
an output device;
a processor device operably coupled to the input device and the output device; and
a memory device operably coupled to the processor device and comprising:
a stack structure comprising tiers each comprising a conductive structure and an insulative structure vertically neighboring the conductive structure;
a source structure overlying the stack structure;
digit line structures underlying the stack structure;
semiconductive structures comprising epitaxial semiconductive material vertically extending through the source structure and at least an uppermost tier of the tiers of the stack structure;
cell pillar structures coupled to the semiconductive structures and the digit line structures and vertically extending through at least one additional tier of the tiers of the stack structure vertically underlying the uppermost tier;
conductive routing structures vertically underlying and coupled to the digit line structures;
control logic devices coupled to and at least partially vertically underlying the conductive routing structures; and
additional conductive routing structures coupled to and vertically overlying the source structure.

* * * * *

UNITED STATES PATENT AND TRADEMARK OFFICE
CERTIFICATE OF CORRECTION

PATENT NO. : 11,335,602 B2
APPLICATION NO. : 16/905763
DATED : May 17, 2022
INVENTOR(S) : Kunal R. Parekh Page 1 of 1

It is certified that error appears in the above-identified patent and that said Letters Patent is hereby corrected as shown below:

In the Specification

| | | |
|---|---|---|
| Column 2, | Line 28, | change "ON/OFT speed," to --ON/OFF speed,-- |
| Column 11, | Line 11, | change "such as $SiO_2$," to --such as $SiO_2$;-- |
| Column 22, | Line 34, | change "and to from form" to --and to form-- |

Signed and Sealed this
Sixth Day of September, 2022

Katherine Kelly Vidal
*Director of the United States Patent and Trademark Office*